(12) United States Patent
Garcia Gonzalez et al.

(10) Patent No.: US 9,438,261 B2
(45) Date of Patent: Sep. 6, 2016

(54) CAPACITANCE-TO-DIGITAL CONVERTER AND METHOD FOR PROVIDING A DIGITAL OUTPUT SIGNAL

(71) Applicant: ams AG, Unterpremstaetten (AT)

(72) Inventors: Jose Manuel Garcia Gonzalez, Valencia (ES); Joel Bertomeu Mestre, Valencia (ES); Rafael Serrano Gotarredona, Valencia (ES)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 14/683,119

(22) Filed: Apr. 9, 2015

(65) Prior Publication Data

US 2015/0295587 A1    Oct. 15, 2015

Related U.S. Application Data

(60) Provisional application No. 61/977,300, filed on Apr. 9, 2014.

(30) Foreign Application Priority Data

Jun. 6, 2014    (EP) .................................... 14171589

(51) Int. Cl.
*H03M 1/06*       (2006.01)
*H03M 1/10*       (2006.01)
(Continued)

(52) U.S. Cl.
CPC ............. *H03M 1/1019* (2013.01); *H03M 1/12* (2013.01); *H03M 3/356* (2013.01); *H03M 3/382* (2013.01); *H03M 3/458* (2013.01); *G01R 27/2605* (2013.01); *H03M 3/34* (2013.01)

(58) Field of Classification Search
CPC .......... H03M 1/10; H03M 1/19; H03M 1/34; H03M 1/12; G01R 27/2605
USPC ........ 341/118, 155, 120, 143, 144, 165, 172
See application file for complete search history.

(56) References Cited

U.S. PATENT DOCUMENTS 4,568,917 A * 2/1986 McKenzie .............. H03M 1/00
                                                            341/118
5,995,033 A * 11/1999 Roeckner ................ H03M 1/02
                                                            341/108
(Continued)

FOREIGN PATENT DOCUMENTS

WO    WO-2006098976 A2    9/2006

OTHER PUBLICATIONS

Mozek, M. et al., "Compensation and signal conditioning of a capacitive pressure sensors", Informacije MIDEM, Jan. 1, 2011, pp. 352-9045, XP055209611, retrieved from the Internet at URL:http://ww.midem-drustvo.si/Journalpapers/MIDEM_41(2011)4p272.pdf, retrieved on Aug. 26, 2015.
(Continued)

*Primary Examiner* — Peguy Jean Pierre
(74) *Attorney, Agent, or Firm* — McDermott Will & Emery LLP

(57) ABSTRACT

A capacitance-to-digital converter (10) comprises a capacitor arrangement (30), a converter (1) that is coupled on its input side to the capacitor arrangement (30) and a calibration unit (13) that is coupled on its input side to the converter (1). The capacitor arrangement (30) comprises an input capacitor (16).

13 Claims, 15 Drawing Sheets

(51) Int. Cl.
*H03M 1/12* (2006.01)
*G01R 27/26* (2006.01)
*H03M 3/00* (2006.01)

(56) References Cited

U.S. PATENT DOCUMENTS

| | | |
|---|---|---|
| 6,191,714 B1 | 2/2001 | Langenbacher |
| 6,448,911 B1* | 9/2002 | Somayajula ........ H03M 1/1019 341/120 |
| 7,324,029 B2 | 1/2008 | Wang |
| 7,362,255 B1 | 4/2008 | Tsyrganovich |
| 8,410,969 B2 | 4/2013 | Krauss et al. |
| 8,547,114 B2 | 10/2013 | Kremin |
| 2007/0247171 A1 | 10/2007 | O'Dowd et al. |
| 2009/0085784 A1* | 4/2009 | Di Giandomenico ... H03M 1/1033 341/141 |
| 2010/0253368 A1 | 10/2010 | Cheng |
| 2011/0018558 A1* | 1/2011 | Saito ..................... G06F 3/0338 324/676 |
| 2012/0112947 A1* | 5/2012 | Krauss .................... H03M 1/60 341/172 |
| 2012/0304742 A1 | 12/2012 | Cummins |
| 2013/0088377 A1* | 4/2013 | Lundstrum ......... H03M 1/1245 341/172 |
| 2015/0002321 A1* | 1/2015 | Zhou ................... H03M 1/0617 341/118 |
| 2015/0102951 A1* | 4/2015 | Watanabe ............. H03M 3/374 341/143 |

OTHER PUBLICATIONS

Analog Devices, Inc., "24-Bit Capacitance-to-Digital Converter with Temperature Sensor A17745/AD7746", Announcement Analog Devices, XX,XX, Apr. 1, 2005, pp. 1-28, XP002388296.

Xia, S. et al.: "A Capacitance-to-Digital Converter for Displacement Sensing with 17b Resolution and 10 μs Conversion", 2012 IEEE International Solid-State Circuits Conference, Digest of Technical Papers (ISSCC), Feb. 19, 1012, pp. 198-200.

Lemkin, M. et al.: "A Three-Axis Micromachined Accelerometer with CMOS Position-Sense Interface and Digital Offset-Trim Electronics", IEEE Journal of Solid-State Circuits, vol. 34, No. 4, Apr. 1999, pp. 456-468.

Jawed, S.A. et al.: "A Switched Capacitor Interface for a Capacitive Microphone", Proceedings of the 2nd conference on Ph. D. Research in Microelectronic and Electronics, Jun. 12-15, 2006, Italy, pp. 385-388.

Bracke, W. et al.: "Ultra Low Power Capacitive Sensor Interfaces", Analog Circuits and Signal Processing Series, Springer 2007, pp. 21-29.

* cited by examiner

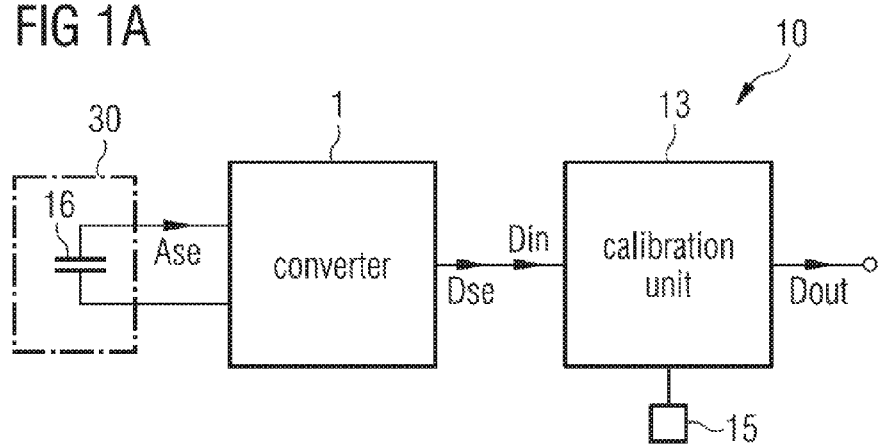
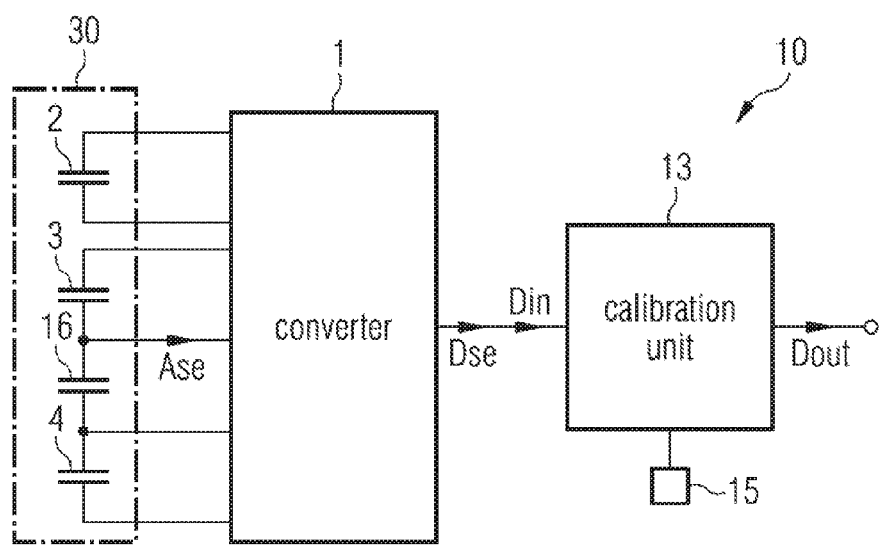

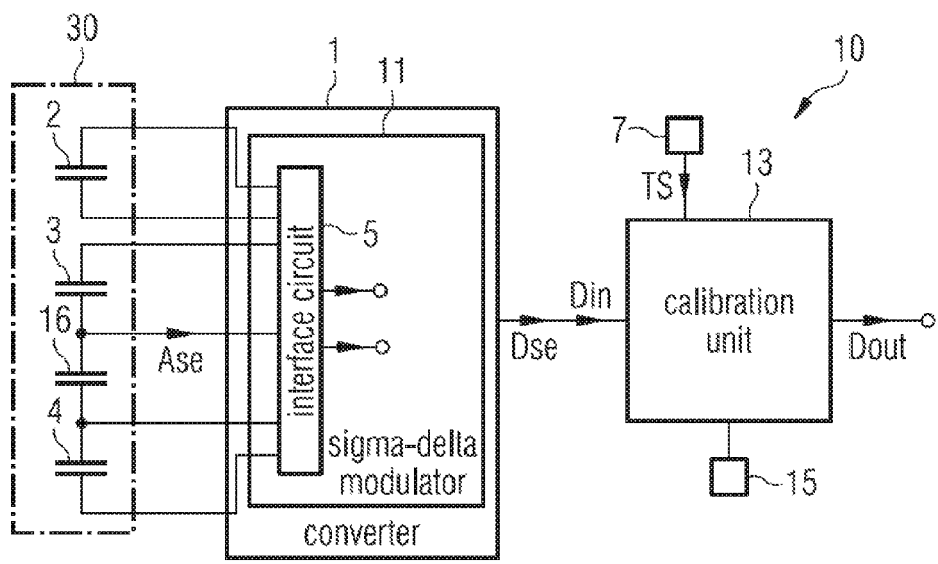
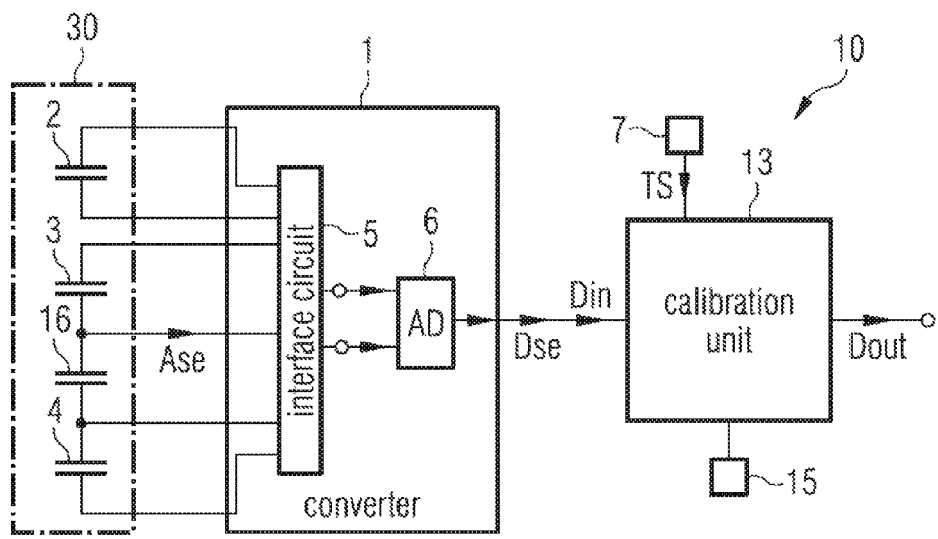

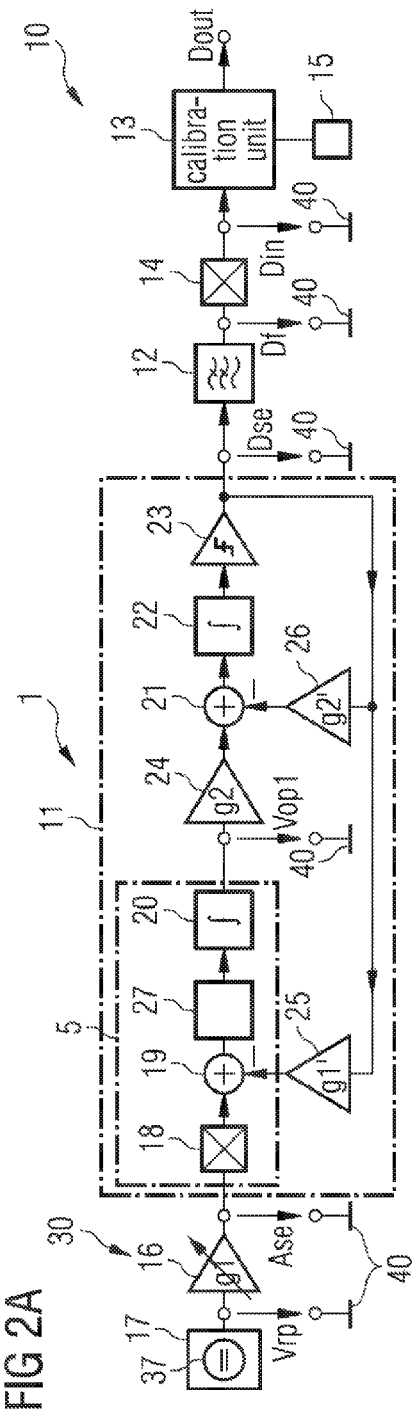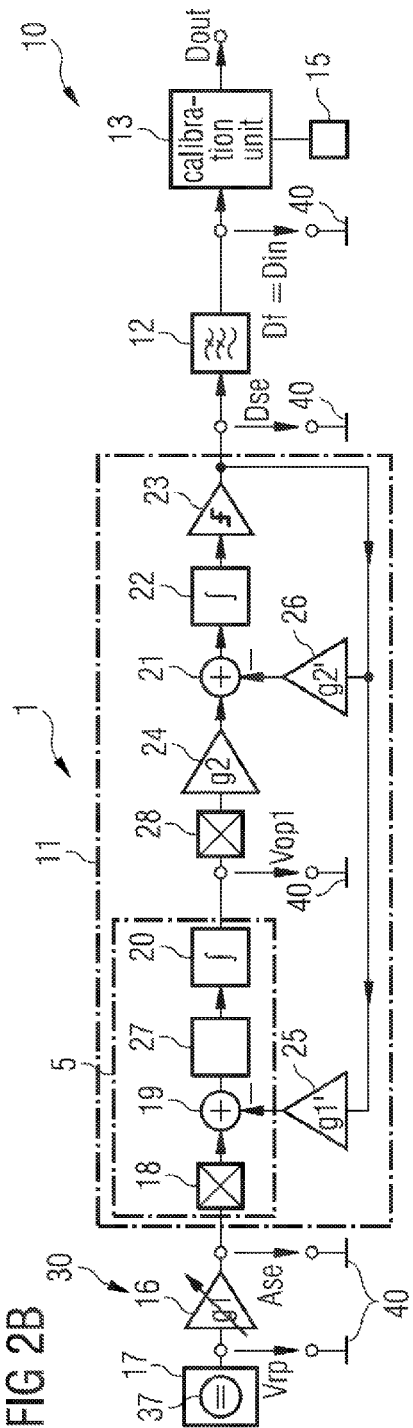

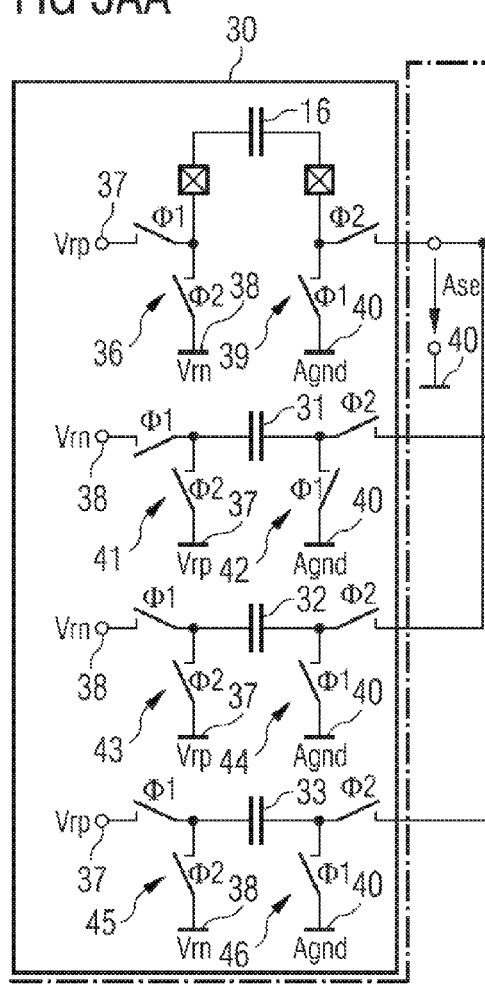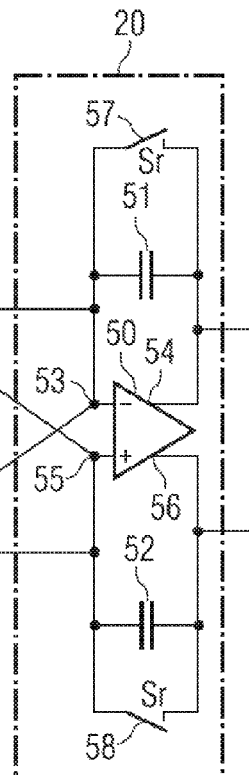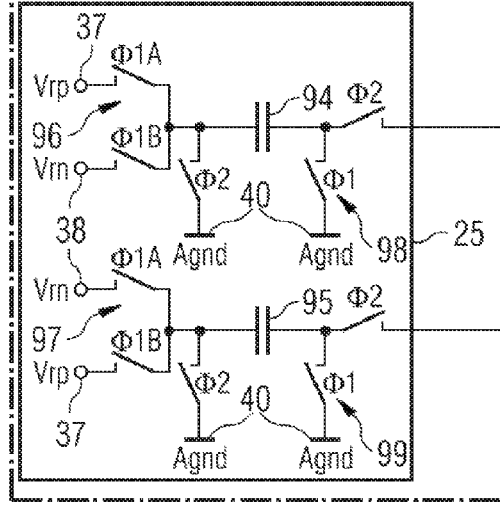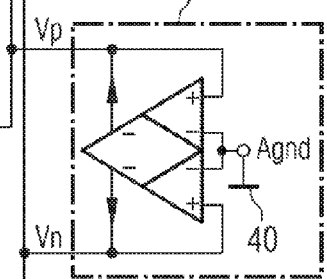

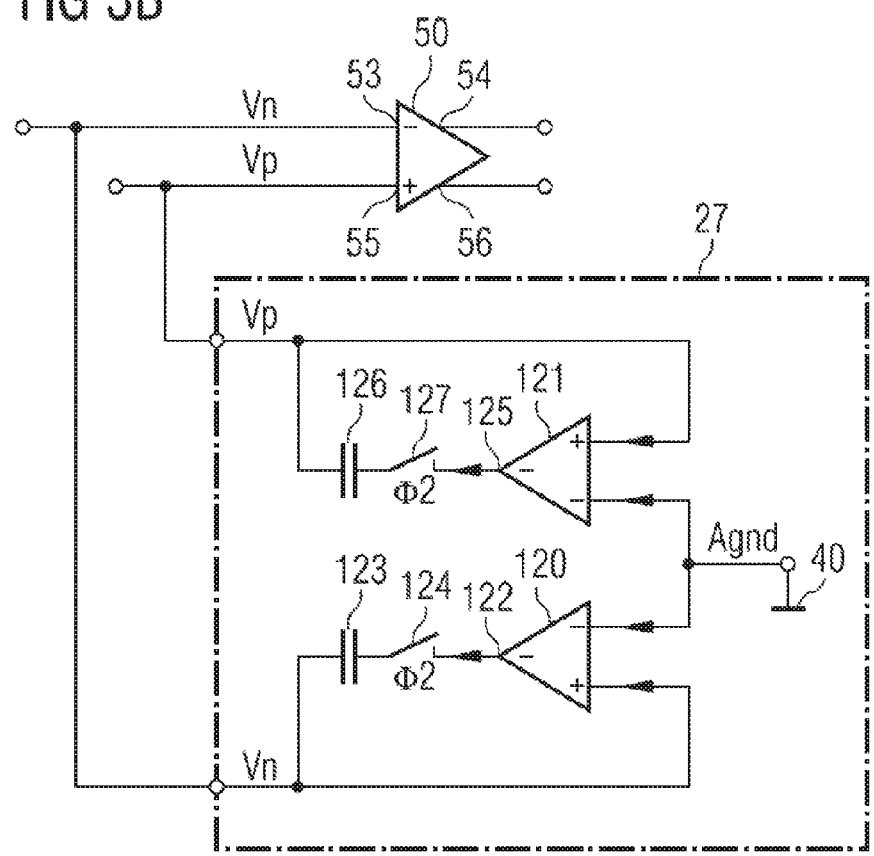

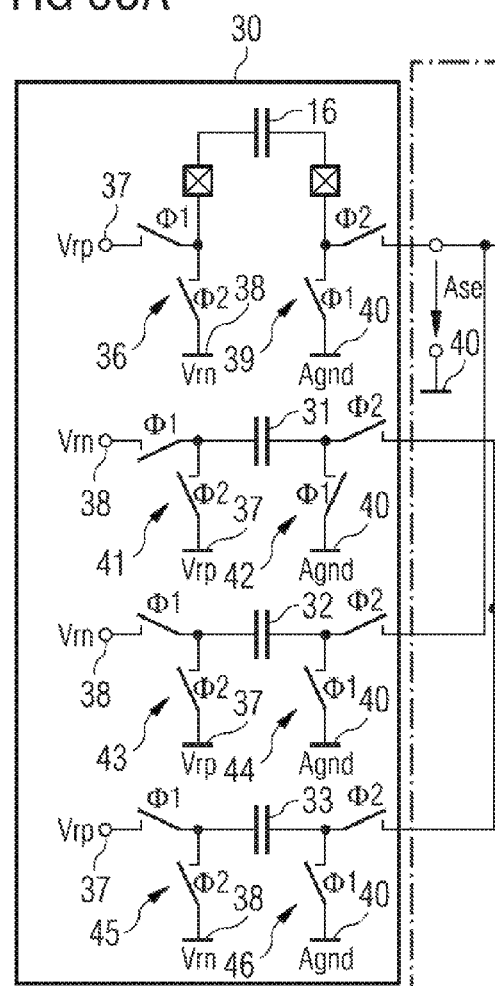
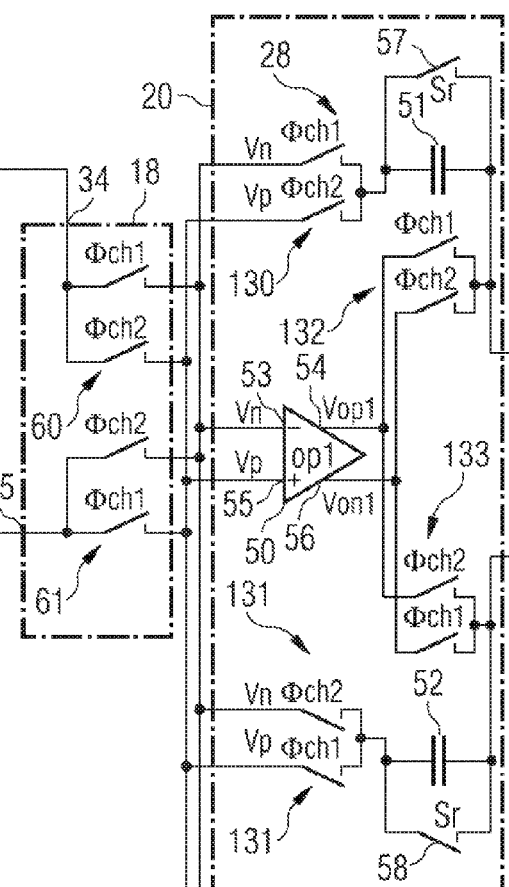
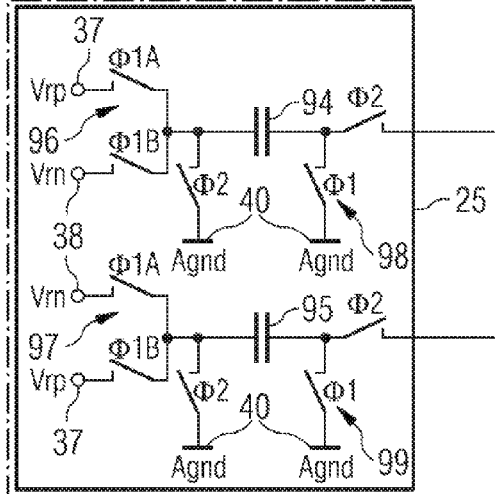
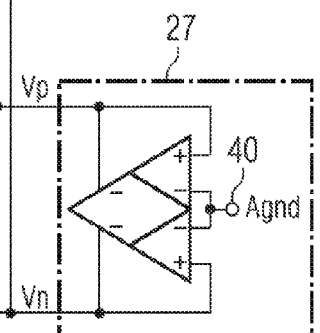

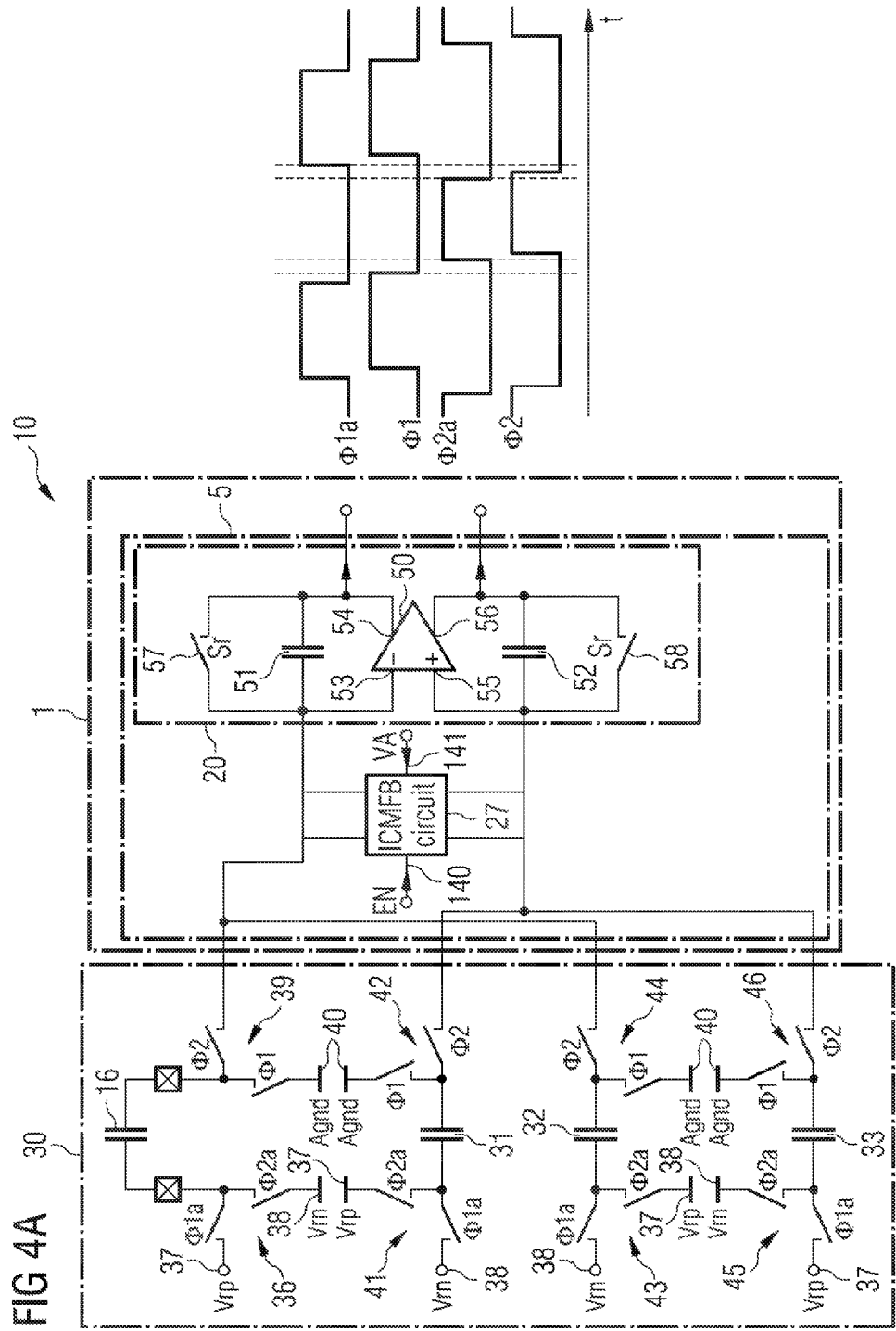

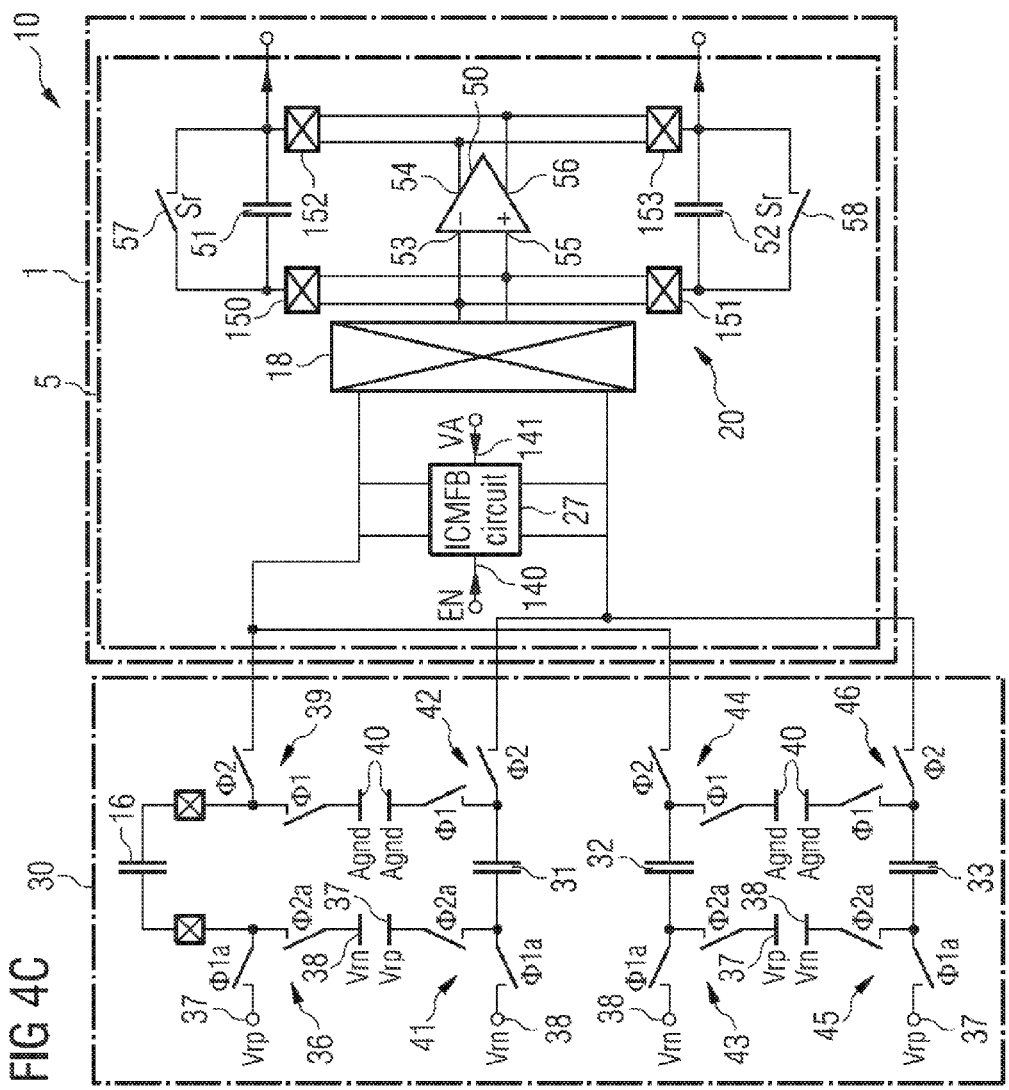

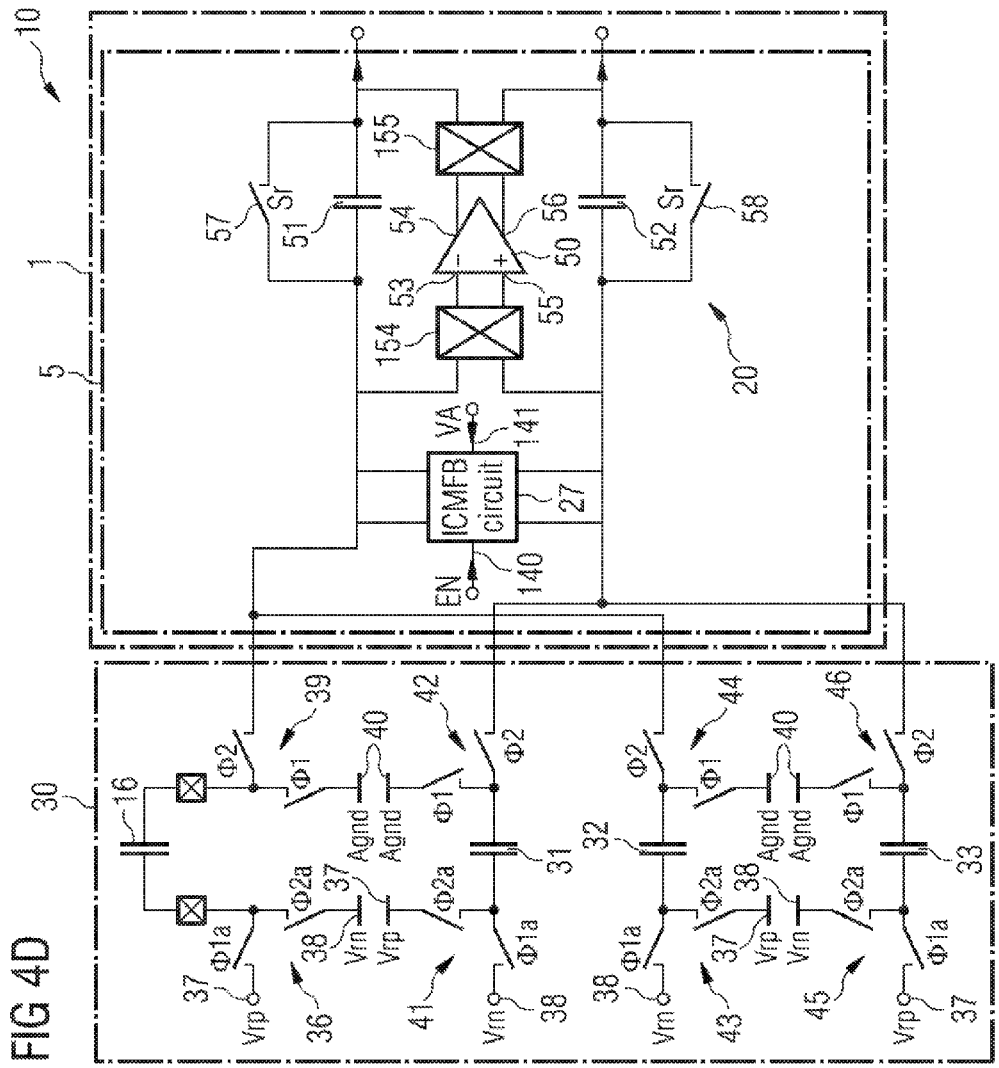

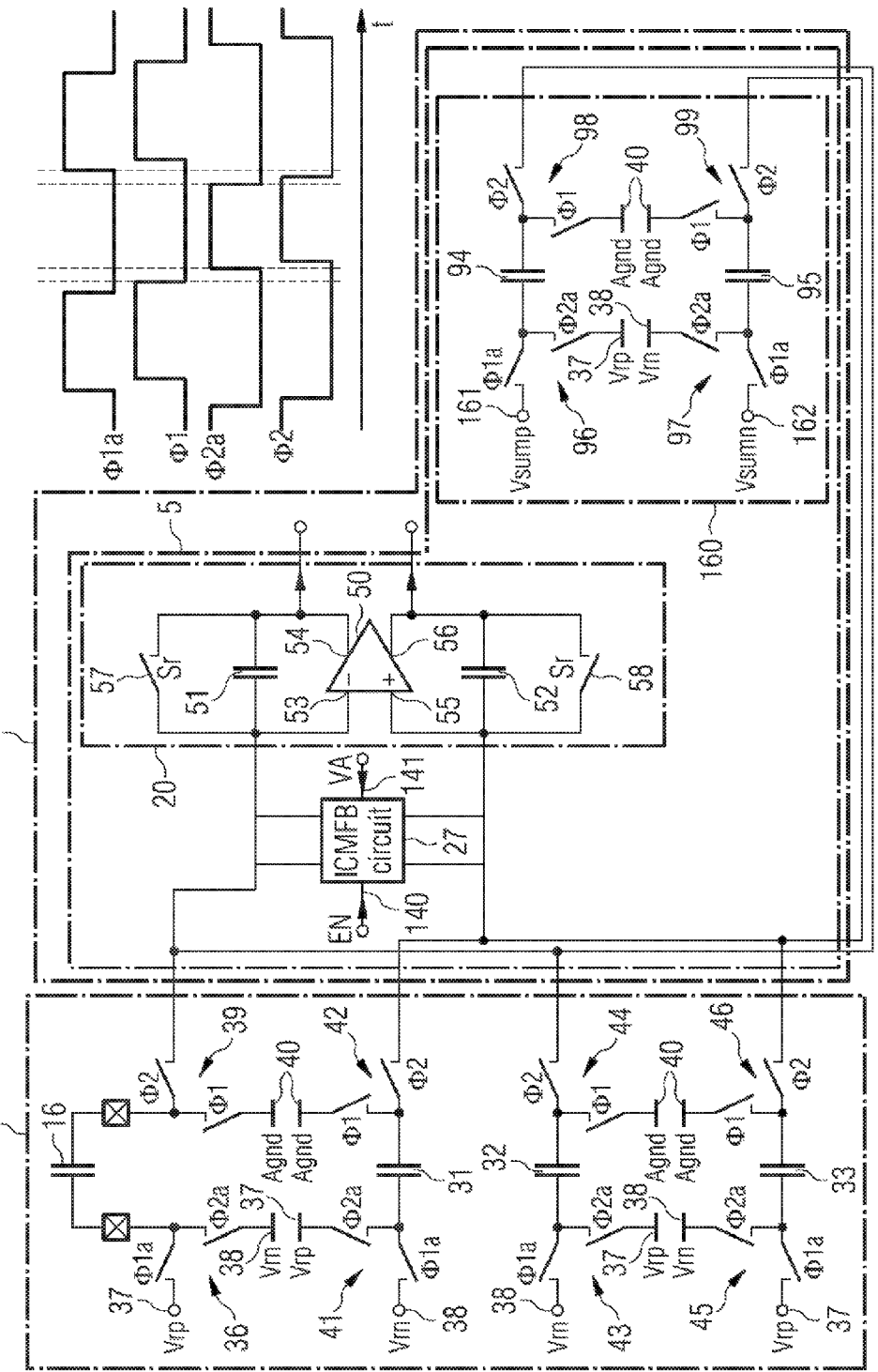

CAPACITANCE-TO-DIGITAL CONVERTER AND METHOD FOR PROVIDING A DIGITAL OUTPUT SIGNAL

BACKGROUND OF THE INVENTION

The present patent application is related to a capacitance-to-digital converter and to a method for providing a digital output signal.

Capacitive sensors are used in many applications to measure chemical and physical parameters. In order to be accurate enough, the measurement of such parameters requires a high resolution and a low-noise capacitance-to-digital converter, abbreviated to CDC. Conventional CDCs generate an intermediate voltage which is then digitized by means of an analog-to-digital converter. In most applications, the power supply rejection ratio, abbreviated to PSRR, is an important parameter. Moreover, most of the capacitive sensors are single-ended. A characteristic such as a high PSRR and a high linearity cannot easily be achieved by a CDC.

Document U.S. Pat. No. 8,410,969 B2 refers to a wide range charge balancing capacitive-to-digital converter. The CDC comprises a single-ended sensor, an offset capacitor, a reference capacitor, an integrator circuit and a demodulation circuit. The integrator circuit comprises one integrator capacitor and one output terminal.

The article M. Lemkin, B. Boser, "A Three-Axis Micromachined Accelerometer with a CMOS Position-Sense Interface and Digital Offset-Trim Electronics", IEEE Journal of Solid-State Circuits, vol. 34, no. 4, pp. 456-468, April 1999 describes a sense element comprising two capacitors. Thus, the sensor is double-ended. Moreover, the accelerometer comprises a sigma-delta feedback loop having an input common-mode feedback.

The article S. A. Jawed et al., "A Switched Capacitor Interface for a Capacitive Microphone", Proceedings of the 2nd Conference on Ph.D. Research in Microelectronics and Electronics, Jun. 12-15, 2006, pp. 385-388, describes a capacitive single-ended microphone, a dummy capacitance and a pseudo differential switched capacitor topology with chopper stabilization.

SUMMARY OF THE INVENTION

In an embodiment, a capacitance-to-digital converter comprises a capacitor arrangement, a converter that is coupled on its input side to the capacitor arrangement and a calibration unit that is coupled on its input side to the converter. The capacitor arrangement comprises an input capacitor.

Advantageously, the calibration unit is used for a calibration that reduces the influence of variations of the input capacitor and the converter during fabrication and the non-linearity of the input capacitor and the converter. The capacitance-to-digital converter is abbreviated as CDC. The calibration unit may be realized as a signal evaluation unit, digital calibration unit or capacitance-to-digital converter calibration unit. The calibration unit may be implemented as a microprocessor or microcontroller. The converter may have a capacitive input.

In an embodiment, the calibration unit is configured to provide a digital output signal that has a polynomial dependency from an input signal of the calibration unit.

In an embodiment, the digital output signal of the calibration unit has a polynomial dependency of a variable which can be either an input capacitance or the inverse of the input capacitance. The input capacitance may be the capacitance of the input capacitor. The input capacitance may be provided by the capacitor arrangement.

In an embodiment, the CDC comprises a temperature sensor having an output coupled to the calibration unit. The temperature sensor provides a temperature signal to the calibration unit. The calibration unit is configured to provide the digital output signal as a function of the input signal of the calibration unit and of the temperature signal.

In an embodiment, the calibration unit is configured to provide the digital output signal that has a polynomial dependency from the input signal of the calibration unit and from the temperature signal.

In an embodiment, the CDC comprises a memory that is coupled to the calibration unit. The memory is realized as a non-volatile memory. The memory stores calibration coefficients or parameters.

In an embodiment, the input capacitor is realized as a single-ended capacitor.

The capacitor arrangement may have exactly one terminal or exactly one output terminal. Alternatively, the capacitor arrangement may have exactly two terminals or exactly two output terminals.

In an embodiment, the input capacitor is implemented as a capacitive sensor.

In an embodiment, the capacitor arrangement comprises a further capacitive sensor. The input capacitor and the further capacitive sensor may detect the same parameter to be measured. The further capacitive sensor may have a different measurement range and/or sensitivity towards the parameter to be measured in comparison to the input capacitor.

In an embodiment, the capacitor arrangement comprises a reference capacitor. The reference capacitor may be realized such that the capacitance value of the reference capacitor can be trimmed or programmed.

In an embodiment, the capacitor arrangement may comprise more than two terminals or more than two output terminals. The input capacitance of the CDC is the capacitor arrangement. The capacitor arrangement comprises the capacitive sensor with more than two terminals. The capacitor arrangement may have the reference capacitor and/or reference capacitors and/or parasitic capacitances.

In an embodiment, the converter comprises an interface circuit that is coupled on its input side to the capacitor arrangement. The interface circuit is realized as a capacitance front-end interface circuit.

In an embodiment, the interface circuit comprises a first integrator. The first integrator may comprises a first amplifier as well as a first and a second integrating capacitor.

The first amplifier may be implemented as an operational transconductance amplifier, abbreviated as OTA, or as an operational amplifier.

In an embodiment, the first integrating capacitor couples a first output of the first amplifier to a first input of the first amplifier. The second integrating capacitor couples a second output of the first amplifier to a second input of the first amplifier.

In an embodiment, the interface circuit comprises a chopping unit. The first integrator is coupled to the capacitor arrangement via the chopping unit.

In an embodiment, the interface circuit comprises a first and a second chopping unit. A first terminal of the first integrating capacitor is coupled to the first and the second input of the first amplifier via the first chopping unit. A first terminal of the second integrating capacitor is coupled to the first and the second input of the first amplifier via the second chopping unit.

In a further development, the interface circuit comprises a third and a fourth chopping unit. A second terminal of the first integrating capacitor is coupled via the third chopping unit to the first and the second output of the first amplifier. Correspondingly, a second terminal of the second integrating capacitor is coupled via the fourth chopping unit of the interface circuit to the first and the second output of the first amplifier.

In an embodiment, the interface circuit comprises an input chopping unit. The first and the second input of the first amplifier are coupled to the capacitor arrangement and to the first and the second integrating capacitor via the input chopping unit.

The interface circuit may additionally comprise a de-chopping unit.

In an embodiment, the first and the second integrating capacitor are realized such that the capacitance value of the first and the second integrating capacitor can be trimmed or programmed.

Thus, each capacitance or capacitor of the CDC can be trimmed or programmed.

Alternatively, at least one of the capacitances or capacitors of the CDC can be trimmed or programmed.

The input capacitor and the further capacitive sensor may not be configured to be trimmed or programmed.

The trimming and programming may be performed during fabrication of the CDC.

In an embodiment, the capacitance front-end interface circuit comprises an input-common-mode feedback circuit, abbreviated as ICMFB circuit.

In an embodiment, the ICMFB circuit comprises a control terminal for receiving a control signal. The ICMFB circuit is designed to be enabled and/or disabled by the control signal. Thus, the capacitance front-end interface circuit is realized by the ICMFB circuit that can be enabled/disabled and senses the input of the first amplifier and provides its feedback to the input of the first amplifier.

In an embodiment, the interface circuit comprises a voltage-summing branch coupled on its output side to the input side of the interface circuit. The voltage-summing branch can be used for adding an offset voltage or offset current to the input side of the converter or as a digital-to-analog converter of a sigma-delta modulator. The voltage-summing branch is realized as a switched capacitor arrangement.

In an embodiment, the converter is realized as a sigma-delta modulator that comprises the capacitance front-end interface circuit.

In an embodiment, the converter comprises at least a second integrator. The first integrator and the at least a second integrator form a cascade of integrators. Thus, the sigma-delta modulator comprises the cascade of integrators.

In an embodiment, the interface circuit implements a first integrator of a cascade of integrators. The sigma-delta modulator forms a sigma-delta loop. A summing voltage is provided from a digital-to-analog converter of the sigma-delta modulator. An output of a quantizer of the sigma-delta modulator is an input of the digital-to-analog converter.

In an embodiment, the converter is realized as a sigma delta modulator with a multi-stage noise shaping structure.

In an embodiment, the CDC comprises a de-chopping unit arranged between the converter and the calibration unit. The de-chopping unit may be located at an output of the quantizer.

In an embodiment, a method for providing a digital output signal comprises providing an analog sensor signal by an input capacitor, generating a digital sensor signal by a converter as a function of the analog sensor signal and providing the digital output signal by a calibration unit that is coupled to the converter.

In an embodiment, the digital output signal has a polynomial dependency from an input signal of the calibration unit.

In an embodiment, a sigma-delta modulator comprises a capacitive sensor, a chopping unit, a first integrator, an input-common-mode feedback circuit and a quantizer. The first integrator is realized as a differential switched-capacitor integrator. The first integrator is coupled on its input side to the capacitive sensor via the chopping unit. The input-common-mode feedback circuit, abbreviated ICMFB circuit, is coupled to the input side of the first integrator. The quantizer is coupled on its input side to an output side of the first integrator. The capacitive sensor may be implemented by the input capacitor.

The first integrator implemented as a differential switched-capacitor integrator results in a high accuracy of the sigma-delta modulation. The sigma-delta modulator is designed for digitalization of a sensor signal generated by the capacitive sensor. Moreover, a high linearity of a signal chain between a parameter to be measured by the capacitive sensor and a digital sensor signal generated by the sigma-delta modulator can be achieved by the ICMFB circuit. Additionally, the chopping unit contributes to the improvement of the electrical characteristics. Advantageously, the capacitive sensor is part of the circuit of the sigma-delta modulator. Alternatively, the ICMFB circuit may be omitted or disabled.

In an embodiment, the sigma-delta modulator comprises a de-chopping unit. The de-chopping unit is coupled on its input side to the first integrator and on its output side to the quantizer. The chopping unit and the de-chopping unit operate together and are both controlled by a timing circuit. Therefore, signals which are applied to the first integrator are chopped by the chopping unit and signals generated by the first integrator are de-chopped by the de-chopping unit.

In an embodiment, the sigma-delta modulator comprises a second integrator. The second integrator couples the de-chopping unit to the quantizer. Thus, the sigma-delta modulator is of the second order.

In an alternative embodiment, the sigma-delta modulator comprises the second integrator that is coupled on its input side to the first integrator and on its output side to the quantizer. The de-chopping may, for example, be performed in the digital domain by a de-chopping unit connected downstream of the sigma-delta modulator. In this embodiment, the sigma-delta modulator is free of a de-chopping unit.

In a further development, the sigma-delta modulator comprises at least a third integrator that is coupled on its input side to the second integrator and on its output side to the quantizer. Thus, the sigma-delta modulator can be realized having an order higher than two, for example with a cascade or a MASH architecture. MASH architecture may be written out as multi-stage noise-shaping architecture.

In an embodiment, the capacitive sensor is designed to measure a physical or a chemical parameter such as pressure, acceleration, proximity, liquid level, particles, humidity, purity and a concentration of a gas.

In an embodiment, the capacitive sensor is realized as a single-ended capacitor. The capacitive sensor consists of exactly one capacitor. The capacitive sensor is free of a further capacitor that is sensitive to the parameter to be measured. The single-ended capacitor has two electrical terminals. Voltages can be applied to these two terminals or tapped at these two terminals.

In an alternative embodiment, the capacitive sensor is realized as a double-ended capacitor. The capacitive sensor comprises a first and a second capacitor that are sensitive to the parameter to be measured. The first capacitor has an increasing capacitance depending on the parameter to be measured and the second capacitor has a decreasing capacitance depending on said parameter. Thus, the capacitive sensor works in a differential manner.

In an embodiment, the sigma-delta modulator comprises a reference capacitor. The reference capacitor is coupled to the first integrator as a reference to the capacitive sensor. The reference capacitor is advantageously foreseen, if the capacitive sensor is realized as a single-ended capacitor. Optionally, a capacitance value of the reference capacitor is approximately equal to a capacitance value of the capacitive sensor. The capacitance value of the reference capacitor may be approximately equal to the middle of a range of the capacitance value of the capacitive sensor.

In case the capacitive sensor is implemented as a double-ended capacitor, a reference capacitor may be omitted.

In an embodiment, the reference capacitor is designed such that the capacitance value of the reference capacitor is controllable. The capacitance value may be set during operation. Alternatively, the capacitance value may be trimmed during fabrication and is constant during operation. The trimming can be realized by one-time programmable elements such as fuses.

In an embodiment, the first integrator is realized as a fully-differential switched-capacitor integrator. Thus, the first integrator comprises two inputs and two outputs operating in a differential manner.

In an embodiment, the first integrator comprises a first amplifier as well as a first and a second integrating capacitor. The first integrating capacitor couples a first output of the first amplifier to a first input of the first amplifier. The second integrating capacitor couples a second output of the first amplifier to a second input of the first amplifier. Thus, the first amplifier is advantageously implemented as a fully-differential amplifier having two input terminals as well as two output terminals. Fully differential means that the first and the second input of the first amplifier operate in a differential manner as well as the first and the second output of the first amplifier operate in a differential manner. The first input of the first amplifier may be designed as an inverting input and the second input as a non-inverting input. The first output of the first amplifier may be realized as a non-inverting output and the second output as an inverting output.

In an embodiment, the ICMFB circuit is coupled on its input side and on its output side to the first and the second input of the first amplifier. The ICMFB circuit has a first and a second input that are connected to the first and the second input of the first amplifier. A first and a second output of the ICMFB circuit is connected to the first and the second input of the first amplifier. The ICMFB circuit comprises a third input that is connected to a ground terminal. The ICMFB circuit comprises a capacitive output stage that is connected via the first and the second output of the ICMFB circuit to the first and the second input of the first amplifier.

In an embodiment, a capacitance-to-digital converter, abbreviated to CDC, comprises the sigma-delta modulator, a digital low-pass filter and a signal evaluation unit. The digital low-pass filter is coupled on its input side to the quantizer. The signal evaluation unit is coupled on its input side to the digital low-pass filter. The digital low-pass filter may generate a filtered output signal. The signal evaluation unit provides a digital output signal depending on the parameter to be measured. The signal evaluation unit may be realized as the calibration unit.

In an embodiment, the signal evaluation unit is designed for calibration and linearization of a signal chain between the parameter to be measured and the digital output signal. The signal chain comprises the digital low-pass filter, the signal evaluation unit and the sigma-delta modulator including the capacitive sensor.

In an embodiment, the CDC comprises a memory. The memory is implemented as non-volatile memory. The memory is coupled to the signal evaluation unit. The memory may store parameters which are used for calibration and linearization of the signal chain. The signal evaluation unit may use a polynomial for calibration. The digital output signal provided by the signal evaluation unit has a polynomial dependency from a filtered signal provided by the digital low-pass filter. A quadratic polynomial, a third order, a fifth order or a higher order polynomial can be applied for calibration and linearization.

In an embodiment, the CDC comprises a temperature sensor. A digital temperature signal is generated by means of the temperature sensor and an analog-to-digital converter. The digital output signal may be a function such as a polynomial function of the filtered output signal and the digital temperature signal. Thus, a high accuracy for the measurement of the physical or chemical parameter can be achieved.

In an embodiment, the CDC comprises a de-chopping unit. The de-chopping unit couples the digital low-pass filter to the signal evaluation unit. Thus, the de-chopping may be implemented in the digital domain. In case a de-chopping unit is comprised by the sigma-delta modulator, a chopping or de-chopping unit is not required between the digital low-pass filter and the signal evaluation unit.

In an embodiment, a method for providing a digital sensor signal by sigma-delta modulation comprises providing an analog sensor signal by a capacitive sensor, chopping the analog sensor signal, and integrating the chopped analog sensor signal by a first integrator realized as a differential switched-capacitor integrator. An input-common-mode feedback is provided to the first integrator. Moreover, the digital sensor signal is generated by quantizing an output signal of the first integrator or of a signal derived from the output signal of the first integrator.

By means of chopping the analog sensor signal, the use of a differential switched capacitor integrator and the input common mode feedback, a high accuracy of the measurement by the capacitive sensor is achieved. The input common mode feedback is generated by an input-common-mode feedback circuit.

Advantageously, the CDC is designed as direct capacitance-to-digital converter. The direct CDC uses a fully-differential architecture to improve PSRR. The CDC performs a digital calibration and/or an input common mode feedback in the first amplifier of the first integrator to obtain a high linearity for the measurement of a capacitance value of the capacitive sensor.

BRIEF DESCRIPTION OF THE DRAWINGS

The patent application will be described in detail below for several exemplary embodiments with reference to the figures. Components, circuit parts and devices that are functionally identical or have the identical effect bear identical reference numbers. Insofar as components, circuit parts or devices correspond to one another in function, a description of them will not be repeated in each of the following figures, wherein:

FIGS. 1A to 1D show exemplary embodiments of a capacitance-to-digital converter, abbreviated as CDC.

FIGS. 2A and 2B show further exemplary embodiments of a CDC with a sigma-delta modulator.

FIGS. 3A to 3C show details of further exemplary embodiments of a CDC with a sigma-delta modulator.

FIGS. 4A to 4F show further exemplary embodiments of a CDC.

DETAILED DESCRIPTION

Figure 3A:
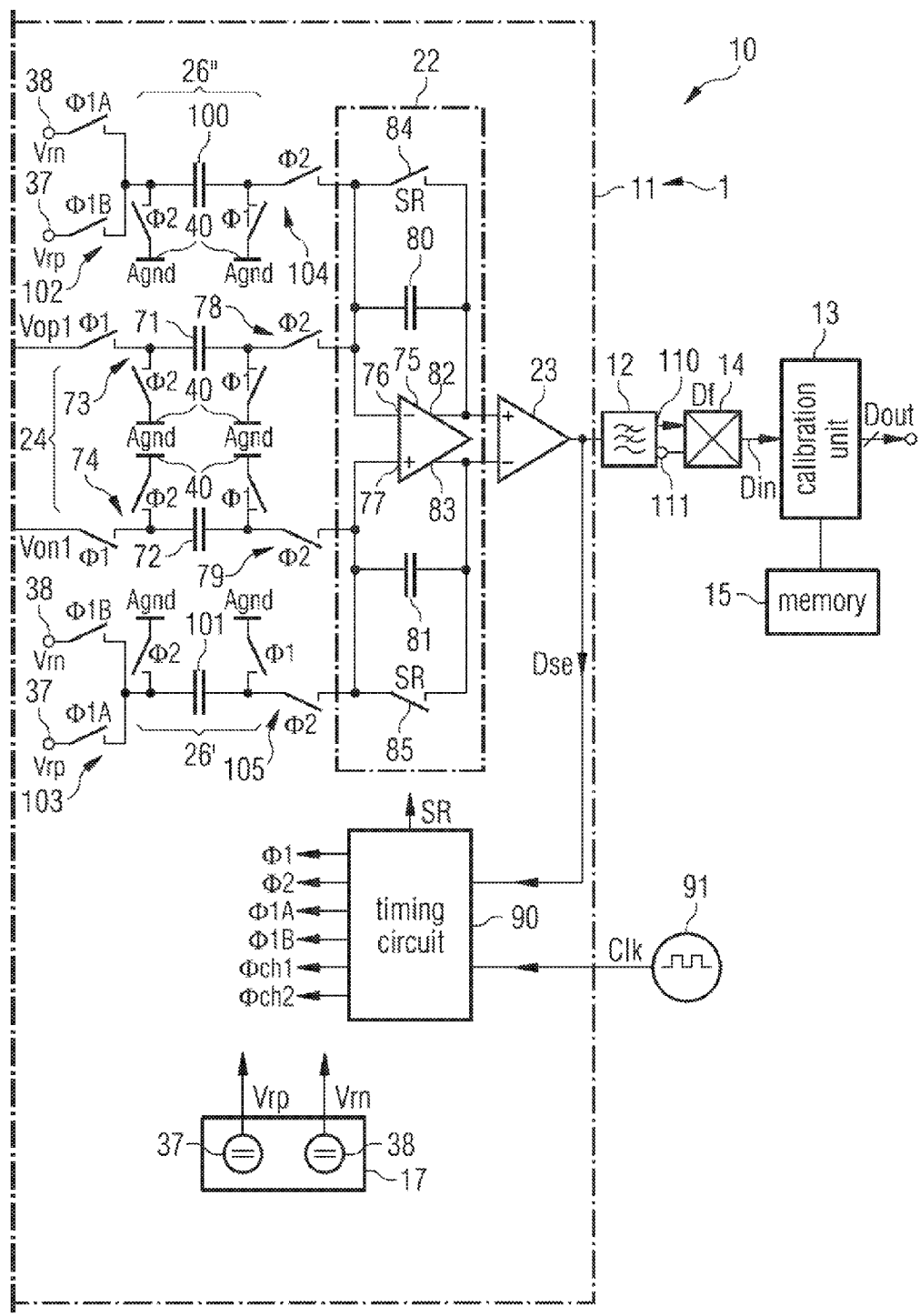

FIG. 1A shows an exemplary embodiment of a capacitance-to-digital converter 10, abbreviated CDC. The CDC 10 comprises a capacitor arrangement 30, a converter 1 and a calibration unit 13. An output of the capacitor arrangement 30 is coupled to an input of the converter 1. An output of the converter 1 is coupled to an input of the calibration unit 13. The capacitor arrangement 30 comprises an input capacitor 16. The input capacitor 16 is coupled to the converter 1. A memory 15 of the CDC 10 is coupled to the calibration unit 13.

An analog sensor signal Ase is provided by the input capacitor 16. The converter 1 generates a digital sensor signal Dse at its output. An input signal Din is provided to the input of the calibration unit 13. The input signal Din depends on the digital sensor signal Dse. The input signal Din may be equal to the digital sensor signal Dse. The calibration unit 13 generates a digital output signal Dout. The input signal Din is a digital signal.

The calibration unit 13 calculates the digital output signal Dout using to the following polynomial function:

$$Dout = \Sigma_{i=0}^{N} a_i \cdot Din^i,$$

wherein $a_i$ is a coefficient and Din is the input signal. Alternatively, the inverse 1/Din of the input signal Din is used instead of the input signal Din in the above mentioned function. The inverse 1/Din is a signal derived from the input signal Din.

The coefficients $a_i$ are determined during a calibration procedure. The coefficients $a_i$ are stored in the memory 15. The coefficients $a_i$ are determined such that the digital output signal Dout has a linear dependency from the quantity to be measured.

The digital output signal Dout has a polynomial dependency of a variable x which can be either the input capacitance C or the inverse of the input capacitance 1/C. The input capacitance may be provided by the capacitor arrangement 30. The input capacitance may be the capacitance of the input capacitor 16.

The digital output signal Dout can be calculated according to the following polynomial function:

$$Dout = \Sigma_{i=0}^{N} a_i \cdot x^i,$$

wherein $a_i$ is a coefficient and x is the variable.

The calibration unit 13 may be designed such that the digital output signal Dout has a linear dependency from the quantity to be measured.

FIG. 1B shows a further exemplary embodiment of the CDC 10 which is a further development of the embodiment shown in FIG. 1A. The input capacitor 16 is realized as a capacitive sensor. Moreover, the capacitor arrangement 30 comprises a further capacitive sensor 2. The further capacitive sensor 2 is coupled to the converter 1. Moreover, the capacitor arrangement 30 comprises a first and a second parasitic capacitance 3, 4. The first and a second parasitic capacitance 3, 4 are additionally connected to the converter 1. The calibration unit 13 may be fabricated as a microprocessor or microcontroller.

The capacitor arrangement 30 is realized by a die or semiconductor body, whereas the converter 1 and the calibration unit 13 are realized by at least a further die or further semiconductor body. The first and the second parasitic capacitance 3, 4 result from the realization of the input capacitor 16 on the semiconductor body or die and by the connection lines between the capacitor arrangement 30 and the converter 1.

The capacitance value of the input capacitor 16 and the capacitance value of the further capacitive sensor 2 depend on the same quantity or parameter to be measured.

The capacitance value of the input capacitor 16 is equal to a first function of the quantity to be measured. The capacitance value of the further capacitive sensor 3 is equal to a second function of the quantity to be measured. The first function is different from the second function.

The further capacitive sensor 2 may have another sensitivity and/or measurement range in comparison to the input capacitor 16.

The input capacitor 16 and the further capacitive sensor 3 may form a differential capacitor.

The digital output signal Dout has a polynomial dependency of the variable x which can be either the input capacitance C or the inverse of the input capacitance 1/C. The input capacitance is provided by the capacitor arrangement 30.

The variable x can be a combination of the capacitance measured value of the capacitance sensor which is composed by more than one capacitance and has more than two terminals.

The converter 1 converts the input capacitance realized by the capacitor arrangement 30 into the digital sensor signal Dse. The variable x is the input capacitance provided by the capacitor arrangement 30. The variable x may be a combination of the capacitance values of the input capacitor 16 and the further sensitive capacitor 2. The digital output signal Dout can be calculated according to the following polynomial function:

$$Dout = \Sigma_{i=0}^{N} a_i \cdot x^i,$$

wherein $a_i$ is a coefficient and x is the variable.

Alternatively. the further capacitive sensor 2 is sensitive to another parameter than the input capacitor 16.

Alternatively, the capacitance value of the input capacitor 16 depends on the parameter to be measured and has a cross-sensitivity to a further parameter. The capacitance value of the further capacitive sensor 2 depends on the further parameter. The CDC 10 combines the capacitance value of the input capacitor 16 and the capacitance value of the further capacitive sensor 2 such that the digital output signal Dout is approximately independent from the further parameter. This may be achieved by the determination of the coefficients $a_i$ during calibration.

In an alternative, not shown embodiment, the capacitor arrangement 30 comprises a reference capacitor. The capacitance value of the reference capacitor is independent from the quantity or parameter to be measured.

FIG. 1C shows a further exemplary embodiment of the CDC 10 which is a further development of the embodiments shown in FIGS. 1A and 1B. The converter 1 comprises an interface circuit 5. The interface circuit 5 is realized as a capacitance front-end interface circuit. The interface circuit 5 is connected on its input side to the capacitor arrangement 30. The converter 1 comprises a sigma-delta modulator 11. The sigma-delta modulator 11 can be named sigma-delta converter 11. The sigma-delta modulator 11 comprises the interface circuit 5.

The CDC 10 comprises a temperature sensor 7 having an output coupled to the calibration unit 13. The temperature sensor 7 generates a temperature signal TS. A digital temperature signal DTS is calculated as a function of the temperature signal TS. The digital temperature signal DTS is a signal derived from the temperature signal TS. The digital temperature signal DTS may be calculated as a function of the temperature signal TS and a value TSref that corresponds to a predetermined reference temperature. The digital temperature signal DTS may be zero at the predetermined temperature. The digital temperature signal DTS may be determined as a function of the difference (TS−TSref) between the temperature signal TS and the value TSref.

The digital temperature signal DTS is generated by the temperature sensor 7 or a not-shown analog-to-digital converter comprised by CDC 10. The digital output signal Dout is a function such as a polynomial function of the input signal Din and the digital temperature signal DTS.

The calibration unit 13 calculates the digital output signal Dout using to the following polynomial function:

$$Dout = \sum_{i=0}^{N} \sum_{j=0}^{M} b_{ij} \cdot DTS^j \cdot Din^i,$$

wherein $b_{ij}$ is a coefficient, DTS is the digital temperature signal and Din is the input signal.

The coefficients $b_{ij}$ are determined during a calibration procedure in which the quantity to be measured and the temperature are varied. The coefficients $b_{ij}$ may be determined such that the digital output signal Dout is insensitive to the temperature e.g. in a predetermined temperature range and optionally also has a linear dependency from the quantity to be measured.

The digital output signal Dout has a polynomial dependency of the variable x and T. The variable x can be either the input capacitance C or the inverse of the input capacitance 1/C. The further variable T can be either the measured temperature or a combination of the measured temperature with the predetermined reference temperature Tref. The measured temperature T is provided by the temperature sensor 7.

The digital output signal Dout is calculated by the following polynomial function:

$$Dout = \sum_{i=0}^{N} \sum_{j=0}^{M} b_{ij} \cdot T^j \cdot x^i,$$

wherein T is the measured temperature. Instead of T also the difference (T−Tref) can be used for calculation of the digital output signal Dout.

The calibration unit 13 is configured such that the digital output signal Dout is insensitive to the temperature e.g. in the predetermined temperature range. Moreover, the calibration unit 13 is configured such that the digital output signal Dout has a linear dependency from the quantity to be measured.

FIG. 1D shows a further exemplary embodiment of the CDC 10 which is a further development of the embodiments shown in FIGS. 1A to 1C. The converter 1 comprises an analog-to-digital converter 6, abbreviated as ADC. An input of the ADC 6 is coupled via the interface circuit 5 to the capacitor arrangement 30. An output of the ADC 6 is coupled to the calibration unit 13. The ADC 6 may be realized as a direct-conversion ADC, flash ADC, successive-approximation ADC or ramp-compare ADC. Thus, the interface circuit 5 can be used for sigma-delta modulation but also for other analog-to-digital conversion principles.

FIG. 2A shows an exemplary embodiment of the capacitance-to-digital converter 10, abbreviated as CDC 10 which is a further development of the embodiments shown in FIGS. 1A to 1C. The CDC 10 comprises the converter 1 having the sigma-delta modulator 11. Moreover, the CDC 10 comprises a digital low-pass filter 12 and the calibration unit 13. The calibration unit 13 can be implemented as signal evaluation unit. An output of the sigma-delta modulator 11 and, thus, an output of the converter 1 is coupled to an input of the digital low-pass filter 12. An output of the digital low-pass filter 12 is coupled to the calibration unit 13. The CDC 10 further comprises a de-chopping unit 14 that couples the digital low-pass filter 12 to the calibration unit 13. Moreover, the memory 15 of the CDC 10 is connected to the calibration unit 13. The CDC 10 comprises the capacitor arrangement 30 having the input capacitor 16. The input capacitor 16 is realized as capacitive sensor.

Alternatively, the sigma-delta modulator 11 comprises the capacitor arrangement 30 having the input capacitor 16 realized as the capacitive sensor 16. The capacitive sensor 16 may be part of the sigma-delta modulator 11.

Moreover, the sigma-delta modulator 11 comprises a reference generator 17 that is connected to the input capacitor 16. The reference generator 17 comprises a positive voltage source 37. A chopping unit 18 of the sigma-delta modulator 11 is connected on its input side to an output of the input capacitor 16. Moreover, the sigma-delta modulator 11 comprises a first adder 19, a first integrator 20, a second adder 21, a second integrator 22 and a quantizer 23 that are connected in series. The series connection couples an output of the chopping unit 18 to the output of the sigma-delta modulator 11 and, thus, to the input of the digital low-pass filter 12. The output of the chopping unit 18 is coupled to a non-inverting input of the first adder 19. The first integrator 20 couples an output of the first adder 19 to a non-subtracting input of the second adder 21. The second integrator 22 couples an output of the second adder 21 to an input of the quantizer 23. An output of the quantizer 23 is coupled via the output of the sigma-delta modulator 11 to the input of the digital low-pass filter 12.

A capacitance value Csens of the input capacitor 16 is variable and depends on a parameter to be measured, as indicated by the arrow across the input capacitor 16. The input capacitor 16 is represented in this figure by a weight amplifier having a factor g1 as a weight. The weight amplifier is used as a symbol, since an analog sensor signal Ase provided by the input capacitor 16 is weighted due to the switched capacitor principle used. Moreover, a weight circuit 24 is arranged between the first integrator 20 and the second adder 21. The weight circuit 24 has a weight factor g2. The weight circuit 24 may be realized as an amplifier.

The output of the quantizer 23 is coupled to subtracting inputs of the first and the second adder 19, 21. A first digital-to-analog converter 25 is arranged between the output of the quantizer 23 and the subtracting input of the first adder 19 and a second digital-to-analog converter 26 is arranged between the output of the quantizer 23 and the subtracting input of the second adder 21. Digital-to-analog converter is abbreviated as DAC. The sigma-delta modulator 11 comprises an input-common-mode feedback circuit 27, abbreviated as ICMFB circuit, which is located between the first adder 19 and the first integrator 20.

The positive voltage source 37 generates a positive reference voltage Vrp that is provided to the input capacitor 16.

At the output of the input capacitor 16, the analog sensor signal Ase is provided. The analog sensor signal Ase is chopped by the chopping unit 18. The chopped analog sensor signal Ase is provided to the non-inverting input of the first adder 19.

An input signal of the first integrator 20 depends on an output signal of the first adder 19 and on an output of the ICMFB circuit 27. An output signal Vop1 of the first integrator 20 is weighted by the weight circuit 24 and is provided to the non-subtracting input of the second adder 21. An output signal of the second adder 21 is integrated by the second integrator 22 and provided after integration to the input of the quantizer 23. The quantizer 23 generates a digital sensor signal Dse that is provided to the digital low-pass filter 12.

The quantizer 23 may be realized as a comparator and, thus, generates the digital sensor signal Dse as a one-bit signal. Alternatively, the quantizer 23 may provide the digital sensor signal Dse with at least two bits. The digital sensor signal Dse is provided via the first DAC 25 to the subtracting input of the first adder 19. Additionally, the digital sensor signal Dse is applied via the second DAC 26 to the subtracting input of the second adder 21.

The digital sensor signal Dse is low-pass filtered by the digital low-pass filter 12 that generates a filtered output signal Df that is de-chopped by the de-chopping unit 14. An output signal of the de-chopping unit 14 is calibrated and linearized by the calibration unit 13. The calibration unit 13 uses parameters stored in the memory 15. The calibration unit 13 provides a digital output signal Dout.

The interface circuit 5 may comprise at least one circuit of the first integrator 20, the chopping unit 18, the first adder 19 and the ICMFB circuit 27.

Alternatively, the ICMFB circuit 27 may be omitted.

In an alternative, not shown embodiment, the de-chopping unit 14 and the digital low-pass filter 14 are interchanged. Thus, an input of the de-chopping unit 14 is connected to the output of the sigma-delta modulator 11 and, thus, to the output of the converter 1. An output of the digital low-pass filter 14 is connected to the calibration unit 13. The digital low-pass filter 14 filter can be skipped, bypassed or integrated inside the calibration unit 13.

FIG. 2B shows a further exemplary embodiment of the CDC 10 which is a further development of the embodiment shown in FIGS. 1A to 1C and 2A. In the circuit of FIG. 2A, the chopping unit 18 is part of an analog portion of a signal chain and the de-chopping unit 14 is part of a digital portion of the signal chain. According to FIG. 2B, the chopping unit 18 and a de-chopping unit 28 are both part of the analog portion of the signal chain. The de-chopping unit 28 is located at the output side of the first integrator 20. The de-chopping unit 28 couples the output of the first integrator 20 to the weight circuit 24 and, thus, to the non-subtracting input of the second adder 21.

An influence of a long-term offset drift is reduced either by chopping the whole CDC 10 as shown in FIG. 2A, wherein the de-chopping takes place in the digital domain, or by chopping the whole first integrator 20 as shown in FIG. 2B.

FIG. 3A shows a further exemplary embodiment of the CDC 10 which is a further development of the embodiments shown in FIGS. 1A to 1C, 2A and 2B. The CDC 10 illustrated by FIG. 3A corresponds to the block diagram shown in FIG. 2A. The CDC 10 comprises the capacitor arrangement 30. The capacitor arrangement 30 is connected to the input side of the converter 1 and, thus, to the input side of the sigma delta modulator 11. The capacitor arrangement 30 comprises the input capacitor 16 and a reference capacitor 31. Moreover, the capacitor arrangement 30 comprises a further and an additional reference capacitor 32, 33. One of the further and the additional reference capacitor 32, 33 and the reference capacitor 31 can be realized as the further sensitive capacitor 2 shown in FIGS. 1B to 1D. The chopping unit 18 comprises a first and a second input 34, 35. The input capacitor 16 has a first and a second terminal that can also be named first and second electrode. The reference generator 17 comprises the positive and a negative voltage source 37, 38. The first terminal of the input capacitor 16 is connected via a first changeover switch 36 to the positive voltage source 37 and to the negative voltage source 38. The second terminal of the input capacitor 16 is coupled via a second changeover switch 39 either to the first input 34 of the chopping unit 18 or to a ground terminal 40.

Similarly, the reference capacitor 31 has a first terminal that is coupled via a third changeover switch 41 to the positive and the negative voltage source 37, 38. A second terminal of the reference capacitor 31 is coupled via a fourth changeover switch 42 either to the second input 35 of the chopping unit 18 or to the ground terminal 40.

Correspondingly, the further reference capacitor 32 has a first terminal coupled via a fifth changeover switch 43 to the positive and the negative voltage source 37, 38 and a second terminal coupled via a sixth changeover switch 44 to the first input 34 of the chopping unit 18 or to the ground terminal 40. The additional reference capacitor 33 has a first terminal coupled via a seventh changeover switch 45 to the positive and the negative voltage source 37, 38 and a second terminal coupled via an eighth changeover switch 46 to the second input 35 of the chopping unit 18 or to the ground terminal 40.

Thus, the input capacitor 16 and the further reference capacitor 32 are connected in parallel to the first input 34 of the chopping unit 18 and the reference capacitor 31 and the additional reference capacitor 33 are connected in parallel to the second input 35 of the chopping unit 18.

On the output side, the chopping unit 18 is connected to the input of the first integrator 20. The first integrator 20 comprises a first amplifier 50 as well as a first and a second integrating capacitor 51, 52. The first integrating capacitor 51 couples a first input 53 of the first amplifier 50 to a first output 54 of the first amplifier 50. The second integrating capacitor 52 couples a second input 55 of the first amplifier 50 to a second output 56 of the first amplifier 50. The first input 53 of the first amplifier 50 may be implemented as an inverting input and the second input 55 of the first amplifier 50 may be realized as a non-inverting input. The first output 54 of the first amplifier 50 may be implemented as a non-inverting output, whereas the second output 56 of the first amplifier 50 may be realized as an inverting output. The first amplifier 50 may be implemented as an operational amplifier. Alternatively, the first amplifier 50 may be realized as a transconductance amplifier. The first and the second integrating capacitor 51, 52 have the same capacitance value Ci.

Moreover, the first integrator 20 comprises a first and a second reset switch 57, 58. The first reset switch 57 is arranged between a first and a second terminal of the first integrating capacitor 51. Correspondingly, the second reset switch 58 is located between a first and a second terminal of the second integrating capacitor 52.

The chopping unit 18 comprises a first and a second chopping changeover switch 60, 61. The first chopping changeover switch 60 has one input terminal connected to the first input 34 of the chopping unit 18 and has two output terminals connected to the first and the second inputs 53, 55 of the first amplifier 50. Correspondingly, the second chopping changeover switch 61 has one input terminal connected to the second input 35 of the chopping unit 18 and has two output terminals connected to the first and the second input 53, 55 of the first amplifier 50.

Furthermore, the ICMFB circuit 27 is connected on its input side to the first and the second input 53, 55 of the first amplifier 50 and to the ground terminal 40. The ICMFB circuit 27 comprises two output terminals that are connected to the first and the second input 53, 55 of the first amplifier 50. Further details of the ICMFB circuit 27 are shown in FIG. 3B.

In addition, the sigma-delta modulator 11 comprises the weight circuit 24 coupled on its input side to the first and second output 54, 56 of the first amplifier 50. The weight circuit 24 comprises a first and a second weight capacitor 71, 72. A first weight changeover switch 73 couples a first terminal of the first weight capacitor 71 to the first output 54 of the first amplifier 50 and to the ground terminal 40. Moreover, a first electrode of the second weight capacitor 72 is coupled via a second weight changeover switch 74 to the second output 56 of the first amplifier 50 and to the ground terminal 40.

The second integrator 22 of the sigma-delta modulator 11 comprises a second amplifier 75 having a first and a second input 76, 77. The first input 76 may be implemented as an inverting input, whereas the second input 77 may be realized as non-inverting input. The second electrode of the first weight capacitor 71 is coupled via a third weight changeover switch 78 to the first input 76 of second amplifier 75 and to the ground terminal 40. Similarly, a second electrode of the second weight capacitor 72 is coupled via a fourth weight changeover switch 79 to the second input 77 of the second amplifier 75 and to the ground terminal 40.

The second integrator 22 comprises a third and a fourth integrating capacitor 80, 81. The third integrating capacitor 80 couples a first output 82 of the second amplifier 75 to the first input 76 of the second amplifier 75. In a corresponding manner, the fourth integrating capacitor 81 couples a second output 83 of the second amplifier 75 to the second input 77 of the second amplifier 75. The first output 82 of the second amplifier 75 may be implemented as a non-inverting output, whereas the second output 83 of the second amplifier 75 may be designed as an inverting output. The second integrator 22 comprises a third and a fourth reset switch 84, 85. The first reset switch 84 connects a first electrode to a second electrode of the third integrating capacitor 80. Similarly, the second reset switch 85 connects a first terminal to a second terminal of the fourth integrating capacitor 81.

The two inputs of the quantizer 23 are connected to the two outputs 82, 83 of the second amplifier 75. The quantizer 23 is implemented as a comparator. A first input of the quantizer 23 is connected to the first output 82 of the second amplifier 75 and a second input of the quantizer 23 is connected to the second output 83 of the second amplifier 75.

The output of the quantizer 23 is coupled back to the input sides of the first and the second integrator 20, 22. The function of the first adder 19, as shown in FIGS. 2A and 2B, is implemented by the first integrator 20. Additionally, the function of the second adder 19 is realized by the second integrator 22. The first DAC 25 is arranged between the output of the quantizer 23 and the first and the second input 53, 55 of the first amplifier 50. Correspondingly, the second DAC 26 couples the output of the quantizer 23 to the first and the second input 76, 77 of the second amplifier 75.

The first DAC 25 comprises a first and a second converter capacitor 94, 95. The first and the second converter capacitor 94, 95 have the same capacitance value Cdac. A first and a second converter changeover switch 96, 97 each comprise three inputs and one output. The three inputs of the first converter changeover switch 96 are connected to the positive voltage source 37, the negative voltage source 38 and the ground terminal 40. Similarly, the three inputs of the second converter changeover 97 are connected to the positive voltage source 37, the negative voltage source 38 and the ground terminal 40. The output of the first converter changeover switch 96 is connected to a first electrode of the first converter capacitor 94. The output of the second converter changeover switch 97 is connected to a first electrode of the second converter capacitor 95. A second electrode of the first converter capacitor 94 is coupled via a third converter changeover switch 98 to the second input 55 of the first amplifier and to the ground terminal 40. A second electrode of the second converter capacitor 95 is coupled via a fourth converter changeover switch 99 to the first input 53 of the first amplifier 50 and to the ground terminal 40.

Figure 3C:
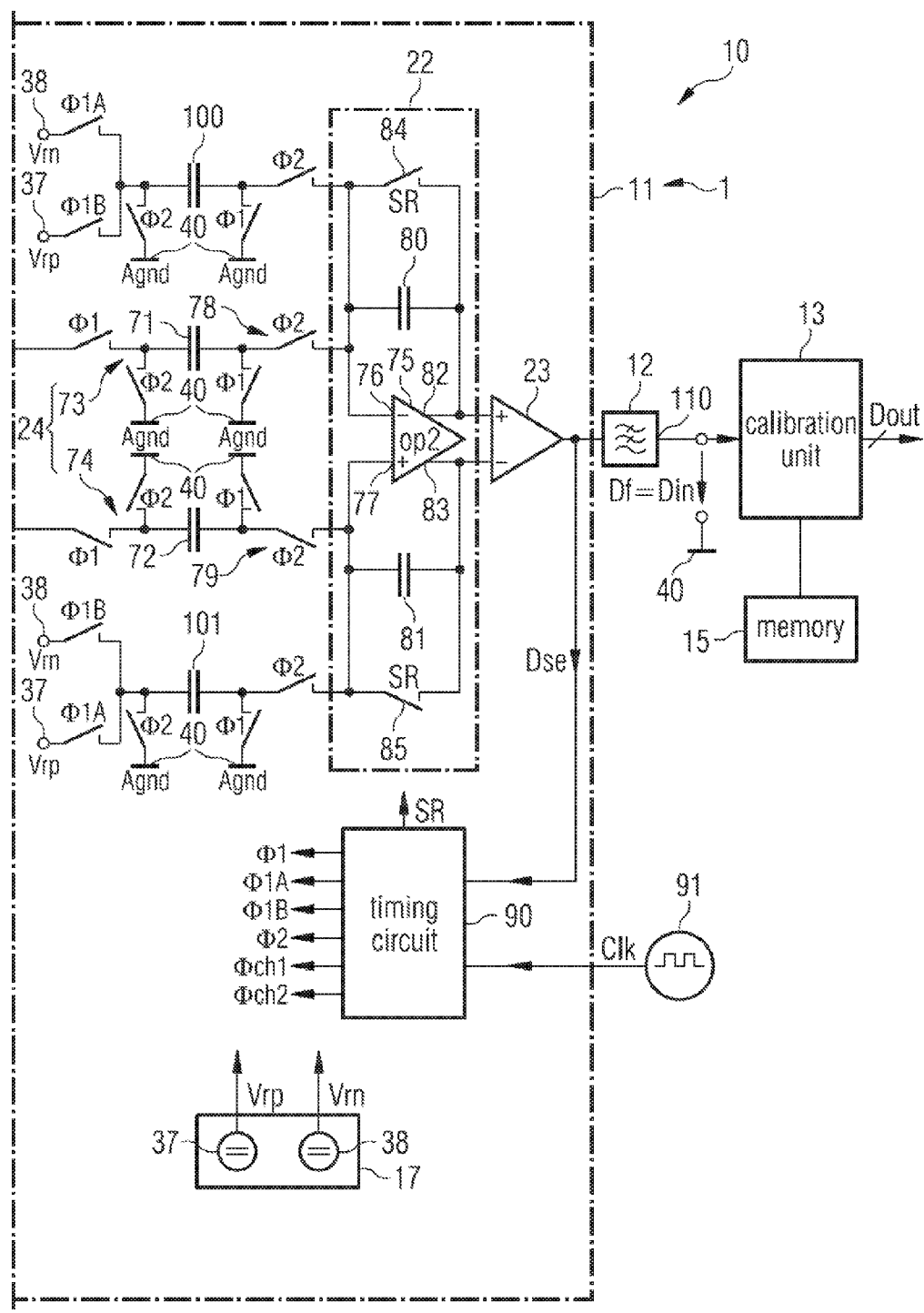

The second DAC 26 comprises a third and a fourth converter capacitor 100, 101. In FIGS. 3A and 3C, the second DAC 26 is drawn in two parts 26' and 26" to achieve a less complicated schematic. However, the two parts 26', 26" belong together and form the second DAC 26. The second DAC 26 comprises a fifth and a sixth converter changeover switch 102, 103 which have three inputs and one output. The fifth and the sixth converter changeover switch 102, 103 are each connected on the input side to the positive voltage source 37, to the negative voltage source 38 and to the ground terminal 40. The output of the fifth and the sixth converter changeover switch 102, 103 are connected to the first electrode of the third and of the fourth converter capacitor 100, 101. A seventh converter changeover switch 104 of the second DAC 26 couples a second electrode of the third converter capacitor 100 to the first input 76 of the second amplifier 82 and to the ground terminal 40. Moreover, an eighth converter changeover switch 105 couples a second electrode of the fourth converter capacitor 101 to the second input 77 of the second amplifier 82 and to the ground terminal 40.

The capacitor arrangement 30, the chopping unit 18, the first integrator 20, the first DAC 25, the weight circuit 24, the second DAC 26 and the second integrator 22 are constructed in a differential manner. Each of said circuit parts comprises two parallel signal paths. The capacitance value Csens of the input capacitor 16 determines the difference between the two signals Vn, Vp at the two inputs of the first integrator 20, the difference between the two output signals Vop1, Von1 at the two outputs of the first integrator 20, the difference between the two signals at the two inputs of the second integrator 22 and the difference between the two signals at the two outputs of the second integrator 22.

The capacitor arrangement 30, the chopping unit 18, the first integrator 20, the first DAC 25, the weight circuit 24, the second DAC 26 and the second integrator 22 are realized as switched capacitor circuit parts.

The output of the quantizer 23 is connected to an input of a timing circuit 90 of the sigma-delta modulator 11. The CDC 10 comprises a clock 91 that is connected to the timing circuit 90. The timing circuit 90 is connected to the control terminal of the switches and changeover switches of the capacitor arrangement 30, the sigma-delta modulator 11 and the de-chopping unit 14. Thus, the quantizer 23 is coupled to the first and the second DAC 25, 26 via the timing circuit 90 that controls the first, second, fifth and sixth converter changeover switches 96, 97, 102, 103. The digital sensor signal Dse determines whether the positive or the negative reference voltage Vrp, Vrn is selected by the first, second, fifth and sixth converter changeover switches 96, 97, 102, 103.

The output of the quantizer 23 is connected to the input of the digital low-pass filter 12. The digital low-pass filter 12 comprises a first and a second output 110, 111 that are both connected to inputs of the de-chopping unit 14. The first output 110 of the digital low-pass filter 12 is a non-inverted output, whereas the second output 111 of the digital low-pass filter 12 is designed as an inverting output. The de-chopping unit 14 comprises one output that is connected to an input of the calibration unit 13. The memory 15 is connected to the calibration unit 13. The memory 15 is realized as a non-volatile memory.

The positive voltage source 37 provides the positive reference voltage Vrp. Correspondingly, the negative voltage source 38 provides a negative reference voltage Vrn. A ground potential Agnd is tapped at the ground terminal 40. The clock 91 generates a clock signal Clk to the timing circuit 90. A period of the clock signal Clk comprises a first phase that is also called a first clock phase and a second phase that is also called a second clock phase. The first phase is a sampling phase and the second phase is an integration phase. A first phase signal $\Phi1$ is provided during the first phase and a second phase signal $\Phi2$ is generated during the second phase by the timing circuit 90. The first and the second phase signal $\Phi1$, $\Phi2$ are applied to the control terminals of the changeover switches as shown in FIG. 3A.

A first and a second chopping phase signal $\Phi ch1$, $\Phi ch2$ are provided to the first and the second chopping changeover switch 60, 61 of the first chopping unit 18 by the timing circuit 90. A reset signal Sr is provided to the reset switches 57, 58, 84, 85 of the first and the second integrator 20, 22 by the timing circuit 90.

The quantizer 23 generates the digital sensor signal Dse and applies it to the timing circuit 90. A positive first phase signal $\Phi1A$ and a negative first phase signal $\Phi1B$ are provided to the first, the second, the fifth and the sixth converter changeover switch 96, 97, 102, 103 by the timing circuit 90. The positive first phase signal $\Phi1A$ and the negative first phase signal $\Phi1B$ are generated depending on the digital sensor signal Dse. When the positive first phase signal $\Phi1A$ is set, the positive reference voltage Vrp is provided to the first electrode of the first and of the fourth converter capacitor 94, 101 and the negative reference voltage Vrn is provided to the first electrode of the second and the third converter capacitor 95, 100. Correspondingly, when the negative first phase signal $\Phi1B$ is set, the negative reference voltage Vrn is provided to the first electrode of the first and of the fourth converter capacitor 94, 101 and the positive reference voltage Vrp is provided to the first electrode of the second and of the third converter capacitor 95, 100.

The input capacitor 16 may be used in many applications to measure a physical and/or a chemical parameter, such as humidity, pressure, acceleration, liquid level, purity, gas concentration and proximity. The CDC 10 is designed as a high-resolution and low-noise cdc such that a measurement of such physical or chemical parameter can be achieved with high accuracy. The CDC 10 has a high power supply rejection ratio, abbreviated as PSRR. The sigma-delta modulator 11 is implemented as a fully-differential circuit to improve the PSRR. Fully-differential means that the first integrator 20 operates in a differential manner on the input side and on the output side. The circuit parts connected to the two inputs of the first integrator 20, such as the chopping unit 18 and the first DAC 25, are also constructed in a differential manner. Additionally, the circuit parts connected to the two outputs of the first integrator 20, such as the weight circuit 24 and the second DAC 26, are constructed in a differential manner.

The embodiments of the CDC 10 shown in FIGS. 1A to 1D, 2A, 2B and 3A to 3C achieve this performance, even if the input capacitor 16 is single-ended and a single-ended to fully-differential conversion is usually highly non-linear. A long term offset drift that is also an important issue in capacitive interfaces is reduced. The architecture of the CDC 10 is based on a sigma-delta modulator 11 where the input of the sigma-delta modulator 11 is directly the capacitive input. The sigma-delta modulator 11 is using a fully-differential architecture. The linearity problem is solved by using an input-common-mode feedback of the operational amplifier 50 of the first integrator 20 and/or a digital calibration.

As shown in FIG. 3A, the CDC 10 is designed such that a chopping of the whole CDC 10 is performed. As illustrated in FIGS. 3A to 3C, the CDC 10 uses a direct CDC converter topology based on a fully-differential sigma-delta modulator architecture. The input capacitor 16 is directly connected to the sigma-delta modulator 11 as sampling capacitor. The single-ended to differential conversion occurs in the first integrator stage 20.

The CDC 10 has a second order topology. Alternatively, the CDC 10 may be of the first order or of a higher order than two. The CDC operation can be extrapolated to higher order cascade or mash architectures. The CDC bit stream is decimated by the digital low-pass filter 12 and the output of the digital low-pass filter 12 is passed to the calibration unit 13 where a calibration polynomial is applied. The coefficients of the calibration polynomial are stored in the non-volatile memory 15 and were calculated by previous measurement.

Two different schemes are proposed to remove the long term offset drift. In the first approach as shown in FIGS. 2A and 3A, the whole CDC 10 is chopped and the de-chopping takes place after the digital low-pass filter 12 by averaging every second measurements. This chopping scheme may be used by implementing the CDC 10 as an incremental CDC with low output data rate by changing the direction of the chopper changeover switches 60, 61 after the end of each measurement.

The single-ended to differential conversion which takes place in the first integrator 20 has the effect that the input common mode voltage of the first amplifier 50 depends on the capacitance value Csens of the input capacitor 16. This dependency may cause a high non-linearity. The input common mode dependency of the first amplifier 50 on the capacitance value Csens of the input capacitor 16 is compensated by the input common mode circuit 27, abbreviated as ICMFB circuit, which is shown in detail in FIG. 3B. The ICMFB circuit 27 senses the input common mode voltage of the first amplifier 50 and compares it to a predetermined input common voltage. The difference between the wanted and the sensed input common mode voltage is fed to the inputs 53, 55 of the first amplifier 50. The digital calibration is also able to compensate the non-linearity caused by the single-ended to fully-differential conversion.

The CDC 10 is measuring the variations of the capacitance value Csens of the input capacitor 16 with respect to the internal reference capacitors 31, 32, 33. The reference capacitor 31, the further reference capacitor 32 and the additional reference capacitor 33 have the same capacitance value Cx. The capacitance value Cx is adjusted to the middle of the variation of the capacitance value Csens of the input capacitor 16. The value of the capacitance value Cx can be trimmed during fabrication process or a coefficient in the calibration polynomial contains the offset information between the middle value of the capacitance value Csens of the input capacitor 16 and the capacitance value Cx of the reference capacitors 31, 32, 33.

Considering the circuit in FIG. 3A, during the first phase Φ1 that is the sampling phase the terminals of the input capacitor 16 are connected to the ground potential Agnd that is also called internal common mode voltage and to the positive reference voltage Vrp. The converter capacitors 94, 95, 100, 101 of the feedback digital-to-analog converters 25, 26 are also connected between the ground potential Agnd and either the positive or negative reference voltage Vrp, Vrn, depending on the output bit Dse of the quantizer 23 in the previous clock phase. During the second phase Φ2, the integration phase, the previously stored charge is redistributed between the reference capacitors 31, 32, 33, the converter capacitors 94, 95, 100, 101 and the input capacitor 16 and integrated into the integrating capacitors 51, 52.

The filtered output signal Df of the digital low-pass filter 12 for the capacitance value Csens of the input capacitor 16 is:

$$Df = \frac{Csens - Cx}{Cdac * (2^N - 1)},$$

wherein Cx is the capacitance value of the reference capacitors 31, 32, 33, Cdac is the capacitance value of the first and the second converter capacitor 94, 95 and N is the number of bits of the filtered output signal Df.

FIG. 3B shows an exemplary embodiment of the ICMFB circuit 27 which can be implemented in the circuits shown in FIGS. 2A, 2B, 3A and 3C. The ICMFB circuit 27 comprises a first and a second feedback amplifier 120, 121. A first input of the first feedback amplifier 120 is connected to the first input 53 of the first amplifier 50. A first input of the second feedback amplifier 121 is connected to the second input 55 of the first amplifier 50. Second inputs of the first and the second feedback amplifier 120, 121 are connected to the ground terminal 40. An output 122 of the first feedback amplifier 120 is coupled via a first feedback capacitor 123 to the first input 53 of the first amplifier 50. An output 125 of the second feedback amplifier 121 is coupled via a second feedback capacitor 126 to the second input 55 of the first amplifier 50. Moreover, a first and a second feedback switch 124, 127 are connected in series to the first and the second feedback capacitors 123, 126.

The first and the second feedback switches 124, 127 are controlled by the second phase signal Φ2. The ICMFB circuit 27 advantageously reduces the influence of an input common mode voltage shift on the first and the second input 53, 55 of the first amplifier 50. The ICMFB circuit 27 measures an input common mode of the first amplifier 50 and applies a voltage feedback through the feedback capacitors 123, 126. The first inputs of the feedback amplifiers 120, 121 are implemented as non-inverting inputs, whereas the second inputs of the feedback amplifiers 120, 121 are realized as inverting inputs. The outputs 122, 125 of the feedback amplifiers 120, 121 are designed as inverting outputs.

FIG. 3C shows a further exemplary embodiment of the CDC 10 which is a further development of the embodiments shown in FIGS. 1A to 1C, 2A, 2B, 3A and 3B. The CDC 10 illustrated by FIG. 3C corresponds to the block diagram shown in FIG. 2B. The connection of the digital low-pass filter 12 to the calibration unit 13 is free of a chopping or de-chopping unit. The de-chopping unit 28 is arranged between the first integrator 20 and the weight circuit 24.

The de-chopping unit 28 comprises a third to a sixth chopping changeover switch 130 to 133. The third chopping changeover switch 130 couples the first electrode of the first integrating capacitor 51 to the first and to the second input 53, 55 of the first amplifier 50. Correspondingly, the fourth chopping changeover switch 131 couples the first terminal of the second integrating capacitor 52 to the first and the second input 53, 55 of the first amplifier 50. The fifth chopping changeover switch 132 couples the second electrode of the first integrating capacitor 51 to the first and the second output 54, 56 of the first amplifier 50. Correspondingly, the sixth chopping changeover switch 133 couples the second electrode of the second integrating capacitor 52 to the first and the second output 54, 56 of the first amplifier 50.

The third to the sixth chopping changeover switches 130 to 133 are also controlled by the first and the second chopping signal Φch1, Φch2. If the first chopping signal Φch1 is set, the first integrator 20 operates as shown in FIG. 2A. If the second chopping signal Φch2 is set, the first and the second integrating capacitor 51, 52 change their connections to the two inputs 53, 55 and to the two outputs 54, 56 of the first amplifier 50. Thus, the first integrator 20 and the de-chopping unit 28 are combined.

In FIG. 3C, the CDC 10 performs a chopping of the first integrator 20. Thus, two different schemes are proposed to remove the long term offset drift. In the second approach shown in FIG. 3C, the input branches of the first integrator 20 are chopped. The de-chopping takes places by chopping the integrating capacitors 51, 52 of the first integrator 20. This chopping scheme is able to run continuously and can be used without reset in the CDC 10, allowing higher output data rates.

The direct CDC converter topology improves noise with respect to intermediate conversion topologies because the noisy capacitance-to-voltage conversion is skipped. High PSRR is achieved using fully-differential architecture. High linearity is also achieved by correcting the non-linearity of the single-ended to fully-differential conversion using digital calibration of the non-linearity of the CDC 10 and/or input common mode feedback of the first amplifier 50 of the first integrator 20.

The CDC 10 comprises a single-ended to fully-differential switched capacitor integrator using input common-mode feedback. The single-ended to fully-differential switched capacitor integrator is integrated in the sigma-delta modulator 11 to build the CDC 10. The input common-mode feedback circuit 27 improves the linearity of the CDC 10. A digital calibration in addition enhances the overall linearity of the interface to the input capacitor 16.

FIG. 4A shows an exemplary embodiment of the CDC 10 which is a further development of the embodiments described above. The capacitor arrangement 30 is implemented similar to the capacitor arrangement of FIGS. 3A and 3C. The first and the second phase signal Φ1, Φ2 are provided to the capacitor arrangement 30. Additionally, a further first phase signal Φ1a and a further second phase signal Φ2a are provided to the capacitor arrangement 30. The first phase signal Φ1 is a delayed signal with respect to the further first phase signal Φ1a. The second phase signal Φ2 is a delayed signal with respect to the further second phase signal Φ2a. The first phase signal Φ1 does not have an overlap with the second phase signal Φ2 and the further second phase signal Φ2b. The further first phase signal Φ1a does not have an overlap with the second phase signal Φ2 and the further second phase signal Φ2b. The loss of charge of the input capacitor 16 is reduced by the non overlapping of the signals. The signals Φ1, Φ2, Φ1a, Φ2a are shown in the right side on FIG. 4A depending on a time t.

The first and the second phase signal Φ1, Φ2 are applied to the control terminals of the second, fourth, sixth and eighths changeover switch 39, 42, 44, 46. Moreover, the further first and the further second phase signal Φ1a, Φ2a are applied to the control terminals of the first, third, fifth and seventh changeover switch 36, 41, 43, 45. The timing circuit 90 generates the further first and the further second phase signal Φ1a, Φ2a.

The ICMFB circuit 27 comprises a control terminal 140. A control signal EN is provided to the control terminal 140. The ICMFB circuit 27 is enabled and disabled by the control signal EN. Moreover, the ICMFB circuit 27 comprises an input terminal 141. An input signal VA is provided to the input terminal 141. The input signal VA has the form of a voltage. The input signal VA controls at least one of the output signals of the ICMFB circuit 27. The interface circuit 5 comprises the first integrator 20 such as shown in FIGS. 3A and 3C. Thus, the interface circuit 5 comprises the ICMFB circuit 27 and the first integrator 20.

Figure 4B:
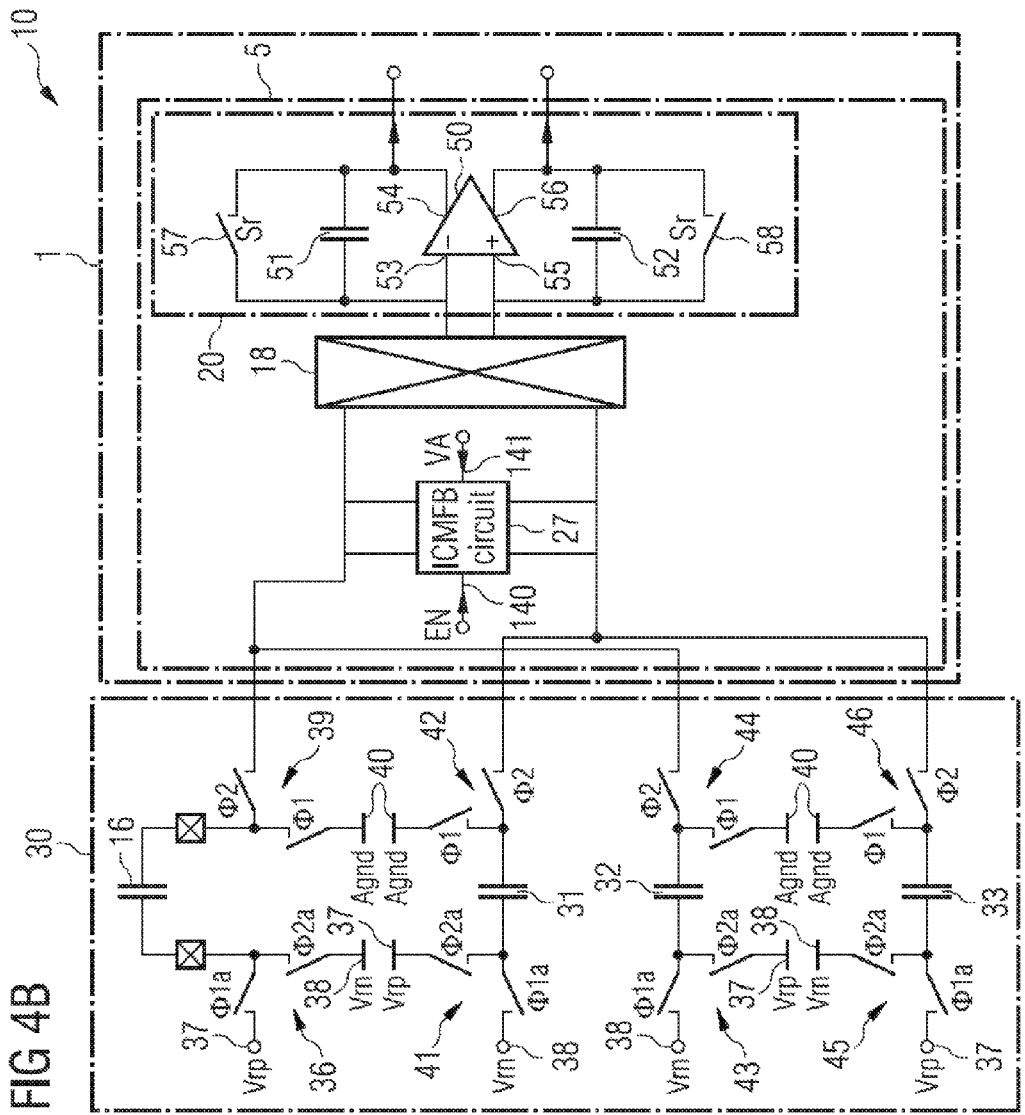

FIG. 4B shows a further exemplary embodiment of the CDC 10 which is a further development of the embodiments described above. The capacitor arrangement 30 is implemented such as shown in FIG. 4A. The interface circuit 5 additionally comprises the chopping unit 18. The chopping unit 18 couples the capacitor arrangement 30 to the first integrator 20. The chopping unit 18 can be implemented by the first and the second chopping changeover switch 60, 61 as shown in FIGS. 3A and 3C. Thus, the interface circuit 5 comprises the ICMFB circuit 27, the chopping unit 18 and the first integrator 20. The interface circuit 5 comprises only one chopping unit, namely the chopping unit 18.

FIG. 4C shows a further exemplary embodiment of the CDC 10 which is a further development of the embodiments described above. The first and the second input 53, 55 of the first amplifier 50 are coupled via the chopping unit 18 to the capacitor arrangement 30. The chopping unit 18 can be implemented by the first and the second chopping changeover switch 60, 61 as shown in FIGS. 3A and 3C.

The interface circuit 5 comprises a first and a second chopping unit 150, 151. The first and the second integrating capacitor 51, 52 are not directly connected to the first and the second input 53, 55 of the amplifier 50. Correspondingly, the first and the second integrating capacitor 51, 52 are not directly connected to the first and the second output 54, 56 of the first amplifier 50.

The first chopping unit 150 couples the first and the second input 53, 55 of the first amplifier 50 to the first terminal of the first integrating capacitor 51. Correspondingly, the second chopping unit 151 couples the first and the second input 53, 55 of the first amplifier 50 to the first terminal of the second integrating capacitor 52. The second terminal of the first integrating capacitor 51 is coupled via a third chopping unit 152 of the interface circuit 5 to the first and the second output 54, 56 of the first amplifier 50. Correspondingly, the second terminal of the second integrating capacitor 52 is coupled via a fourth chopping unit 153 of the interface circuit 5 to the first and the second output 54, 56 of the first amplifier 50. The first chopping unit 150 can be realized by the third chopping changeover switch 130 shown in FIG. 3C. Correspondingly, the second to the fourth chopping unit 151-153 can be implemented by the fourth to the sixth chopping changeover switch 131 to 133 shown in FIG. 3C. The first to the fourth chopping unit 150 to 153 may form the de-chopping unit 28 shown in FIGS. 2B and 3C.

FIG. 4D shows a further exemplary embodiment of the CDC 10 which is a further development of the embodiments described above. The first and the second input 53, 55 of the first amplifier 60 are coupled via an input chopping unit 154 of the interface circuit 5 to the capacitor arrangement 30, to the first integrating capacitor 51 and to the second integrating capacitor 52. The capacitor arrangement 30 is directly and permanently connected to the first terminal of the first integrating capacitor 51 and to the first terminal of the second integrating capacitor 52. The capacitor arrangement 30 is coupled via the input chopping unit 154 to the first and the second input 53, 55 of the first amplifier 50. The input chopping unit 154 may be realized by chopping changeover switches.

The interface circuit 5 comprises an output de-chopping unit 155. The first and the second output 54, 56 of the first amplifier 50 are coupled via the output de-chopping unit 155 to the output of the interface circuit 5. For example, the first and the second output 54, 56 of the first amplifier 50 are coupled via the output de-chopping unit 155 to the input side of the second integrator 22. The output de-chopping unit 155 may comprise the fifth and the sixth chopping changeover switch 132, 133 shown in FIG. 3C. The output de-chopping unit 155 may be implemented as the third and the fourth chopping unit 152, 153. The second terminal of the first integrating capacitor 51 and the second terminal of the second integrating capacitor 52 are directly and permanently connected to the output of the interface circuit 5. The first and the second output 54, 56 of the first amplifier 50 are coupled via the output de-chopping unit 155 to the second terminals of the first and the second integrating capacitor 51, 52.

The input chopping unit 154 and the output de-chopping unit 155 each comprise exactly two input terminals and two output terminals. Additionally, the input chopping unit 154 and the output de-chopping unit 155 may comprise not shown control terminals. Thus, the input chopping unit 154 and the output de-chopping unit 155 are directly arranged at the input side and at the output side of the first amplifier 50.

FIG. 4E shows a further exemplary embodiment of the CDC 10 which is a further development of the embodiments described above. The interface unit 5 additionally comprises a voltage-summing branch 160. The voltage-summing branch 160 is connected on its output side to the input of the interface circuit 5. Thus, the two output terminals of the voltage-summing branch 160 are connected to the input side of the first integrator 20. The two output terminals of the voltage-summing branch 160 are connected to a node of a connection line between the capacitor arrangement 30 and the first integrator 20 and to a further node on a further connection line between the capacitor arrangement 30 and the first integrator 20.

The voltage-summing branch 160 is realized similarly to the first digital-to-analog converter 25 shown in FIGS. 3A and 3C. Thus, the voltage summing branch 160 comprises the first and the second converter capacitor 94, 95 that are coupled via the third and the fourth converter changeover switch 98, 99 to the output terminals of the voltage summing branch 160. The voltage-summing branch 160 comprises a positive and a negative summing voltage source 161, 162. The first converter changeover switch 96 couples the positive summing voltage source 161 and the positive voltage source 37 to the first terminal of the first converter capacitor 94. Correspondingly, the negative summing voltage source 162 and the negative voltage source 38 are coupled via the second converter changeover switch 97 to the first terminal of the second converter capacitor 95.

The positive and the negative voltage-summing source 161, 162 generate a positive and a negative summing voltage Vsump, Vsumn. The first and the second converter changeover switch 96, 97 are controlled by the further first and further second phase signal Φ1a, Φ2a.

Figure 4F:
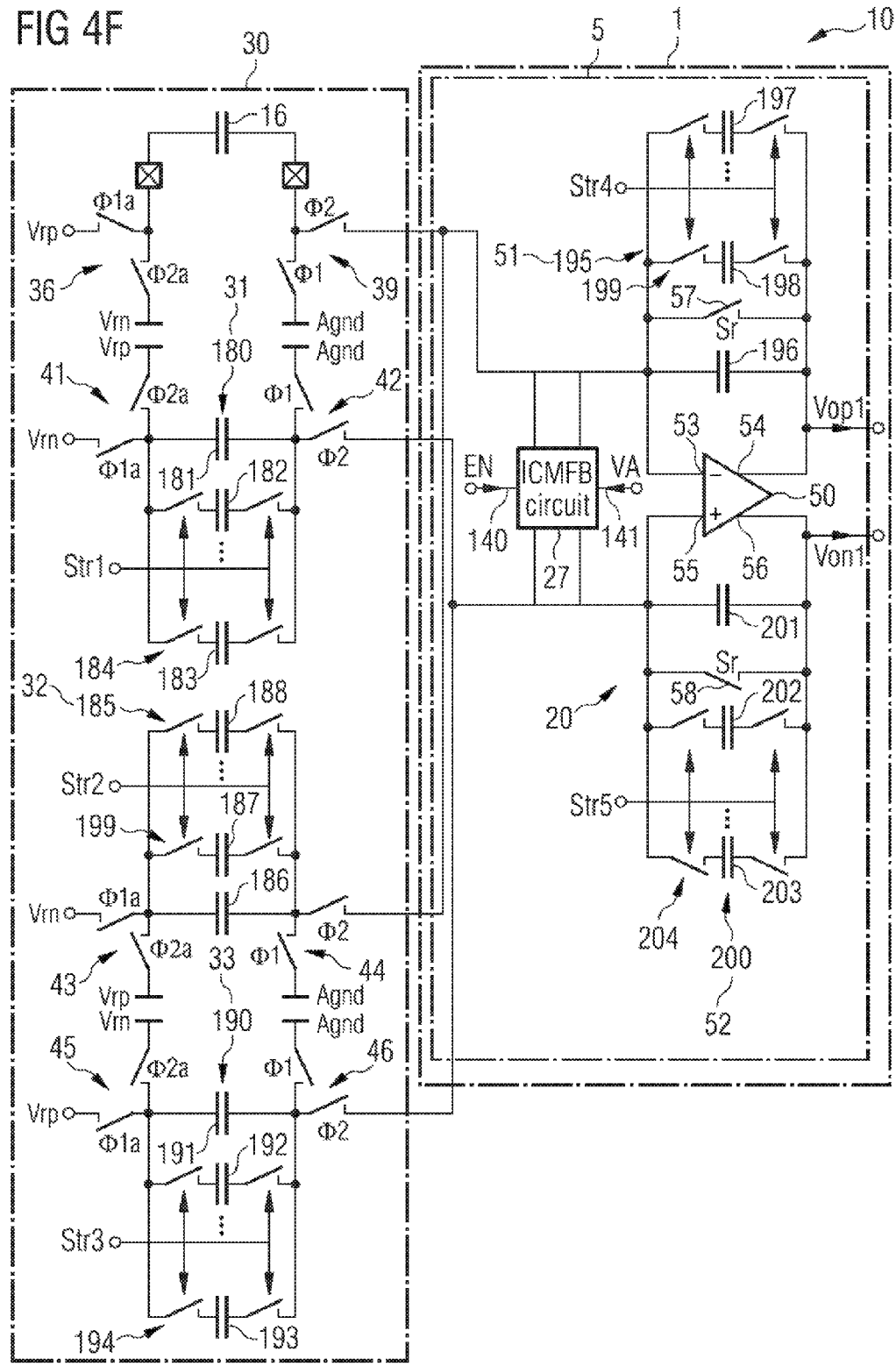

FIG. 4F shows a further exemplary embodiment of the CDC 10 which is a further development of the embodiments described above. The reference capacitor 31 is realized by a capacitor array 180. The capacitor array 180 comprises a first capacitor 181 and at least a further capacitor 182, 183. The capacitor array 180 may comprise additional capacitors. For example, the capacitor array 180 comprises a first number N of capacitors, whereby the first number N is larger than 1. The first and the at least one further capacitor 181 to 183 are arranged in parallel. The capacitor array 180 comprises a switching circuit 184. The switching circuit 184 couples a first terminal of the at least one further capacitor 182, 183 to a first terminal of the first capacitor 181. Correspondingly, the switching circuit 184 couples a second terminal of the at least one further capacitor 182, 183 to a second terminal of the first capacitor 181. The first terminal of the first capacitor 181 is directly and permanently connected to the output of the third changeover switch 41. Correspondingly, the second terminal of the first capacitor 181 is directly and permanently connected to the input of the fourth changeover switch 42. The capacitor array 180 may be realized as a binary coded capacitor array. Alternatively, the capacitor array 180 is realized as a thermometer coded capacitor array.

Alternatively, the first capacitor 181 has the function of a base capacitor. The at least one further capacitor 182, 183 is implemented as a binary coded capacitor array or as a thermometer coded capacitor array.

The switching arrangement 184 is controlled by a trimming signal Str1. The trimming signal Str1 is generated by the memory 15 and/or the calibration unit 13. The capacitance value Cx of the reference capacitor 31 is the sum of the capacitance values of the first capacitor 181 and of the at least one further capacitor 182, 183 which are set active by the trimming signal Str1. The value of the trimming signal Str1 is determined during calibration. The value of the trimming signal Str1 is stored in the memory 15. Thus, the value of the trimming signal Str1 is constant during operation. Alternatively, the value of the trimming signal Str1 is modified during operation of the CDC 10.

Thus, the capacitance value Cx of the reference capacitor 31 is controllable by the trimming signal Str1. The capacitance value Cx of the reference capacitor 31 can be trimmed or programmed. For example, the capacitance value Cx of the reference capacitor 31 is trimmed such that it is approximately equal to the middle of a range of the capacitance value of the input capacitor 16. The capacitance value Cx may be trimmed during calibration and is constant during operation. The calibration is performed during fabrication of the CDC 10. Alternatively, the capacitance value Cx may be set and/or modified during operation. A higher resolution of the parameter to be measured can be achieved by the trimming or programming of the reference capacitor 31.

The further reference capacitor 32 may be realized by a further capacitor array 185. The further capacitor array 185 comprises a further first capacitor 186, at least a further capacitor 187, 188 and a further switching arrangement 189. A further trimming signal Str2 is provided to the further switching arrangement 189.

The additional reference capacitor 33 may be realized by a further capacitor array 190. The further capacitor array 190 comprises a further first capacitor 191, at least a further capacitor 192, 193 as well as a further switching arrangement 194. A further trimming signal Str3 is provided to the further switching arrangement 190.

The first integrating capacitor 51 may be realized by a first capacitor array 195. The first capacitor array 195 comprises a further first capacitor 196, at least a further capacitor 197, 198 and a first switching arrangement 199. A first trimming signal Str4 is provided to the first switching arrangement 199. Correspondingly, the second integrating capacitor 52 may be realized by a second capacitor array 200. The second capacitor array 200 comprises a further first capacitor 201, at least a further capacitor 202, 203 as well as a further switching arrangement 204. A second trimming signal Str5 is provided to the further switching arrangement 204.

The further, the first and the second capacitor arrays 185, 190, 195, 200 may have a structure such as the capacitor array 180 and may be operated similarly to the capacitor array 180.

The reference capacitor 31, the further reference capacitor 32, the additional reference capacitor 33 of the capacitor arrangement 30 shown in FIGS. 1B to 1D, 3A, 3C and 4A to 4D can be realized by the capacitor array 180 and the further capacitor arrays 185, 190 as shown in FIG. 4F. The first and/or the second integrating capacitor 51, 52 of the converter 1 shown in FIGS. 3A, 3C and 4A to 4D can be realized by the first and the second capacitor arrays 195, 200. Only one, two, three, four or all of the capacitors 31, 32, 33, 51, 52 may be implemented by the capacitor arrays 180, 185, 190, 195, 200 as shown in FIG. 4F.

Alternatively, the first and the second converter capacitor 94, 95 can be implemented such as the reference capacitor 31 shown in FIG. 4F.

In an alternative embodiment, not shown, the switching circuit 184 also couples the first and the second terminal of the first capacitor 181 to the third and the fourth changeover switch 41, 42.

Alternatively, the interface circuit 5 and, thus, the sigma delta modulator 11 and, consequently, the converter 1 are realized without ICMFB circuit 27.

Figure 5:
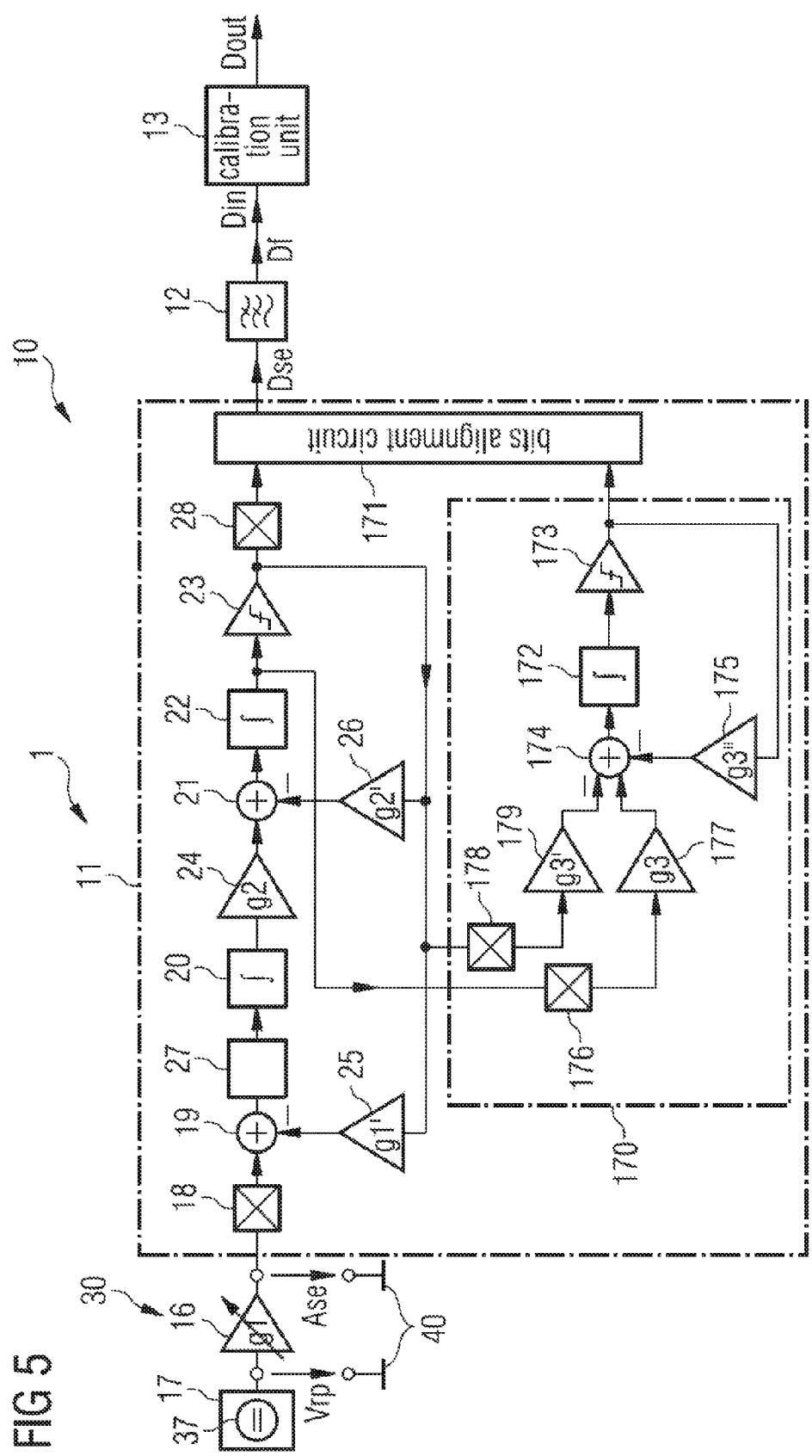
FIG. 5 shows a further exemplary embodiment of a CDC with a sigma-delta modulator.

FIG. 5 shows a further exemplary embodiment of the CDC 10 which is a further development of the embodiments described above. The sigma-delta-modulator 11 is implemented by a multi-stage noise-shaping architecture, abbreviated MASH architecture. The converter 1 is realized such as the sigma-delta-modulator 11 shown in FIG. 2A. However, the de-chopping unit 28 is located at the output side of the quantizer 23 and not of the first integrator 20. According to FIGS. 2A, 2B, 3A, 3C and 5, the sigma-delta-modulator 11 comprises more than one integrator 20, 22 that are serially connected to each other. Thus, the sigma-delta-modulator 11 comprises a cascade of integrators 20, 22.

The sigma-delta-modulator 11 comprises a parallel branch 170 that is coupled on the input side to the input and to the output of the quantizer 23. The sigma-delta-modulator 11 comprises a bits alignment circuit 171 which is coupled on the input side to the output of the quantizer 23 via the de-chopping unit 28 and to the output of the parallel branch 170. The bits alignment circuit 171 is coupled via the digital low-pass filter 12 to the calibration unit 13.

The parallel branch 170 comprises a branch integrator 172 and a branch quantizer 173. An output of the branch integrator 172 is connected to an input of the branch quantizer 173. An output of the branch quantizer 173 is connected to an input of the bits alignment circuit 171. Moreover, the parallel branch 170 comprises a branch adder 174 that is coupled on its output side to an input of the branch integrator 172. The output of the branch quantizer 173 is coupled via the branch digital-to-analog converter 175 to an input of the branch adder 174. The input of the quantizer 23 is coupled via a first branch chopping unit 176 and a first branch digital-to-analog converter 177 to a further input of the branch adder 174. Correspondingly, the output of the quantizer 23 is coupled via a second branch chopping unit 178 and a second branch digital-to-analog converter 179 to an additional input of the branch adder 174. The input and the additional input of the branch adder 174 may be implemented as inverting inputs. The further input of the branch adder 174 may be realized as a non-inverting input.

Alternatively, the digital low-pass filter 12 and/or the bits alignment unit 171 can be skipped, bypassed or integrated inside the calibration unit 13.

Alternatively, the de-chopping unit 14 that is shown in FIGS. 2A and 3A, the de-chopping unit 28 that is shown in FIGS. 2B, 3C and 5 as well as the output de-chopping unit 155 shown in FIG. 4D may be omitted. The de-chopping may be performed by the calibration unit 13.

Alternatively, the chopping unit 14, the first and the second chopping unit 150, 151 and the input chopping unit 154 may be omitted. The converter 1 may be implemented without any chopping unit and without any de-chopping unit. Thus, an area on the semiconductor body comprising the converter 1 is reduced.

We claim:

1. A capacitance-to-digital converter, comprising:
   a capacitor arrangement comprising an input capacitor;
   a converter that is coupled on its input side to the capacitor arrangement; and
   a calibration unit that is coupled on its input side to the converter,
   wherein the converter comprises an interface circuit that is coupled on its input side to the capacitor arrangement and comprises a first integrator having a first amplifier as well as a first and a second integrating capacitor,
   wherein the interface circuit comprises a first and a second chopping unit, such that the first chopping unit couples a first and a second input of the first amplifier to a first terminal of the first integrating capacitor, and the second chopping unit couples the first and the second input of the first amplifier to a first terminal of the second integrating capacitor.

2. The capacitance-to-digital converter according to claim 1, wherein the calibration unit is configured to provide a digital output signal that has a polynomial dependency from an input signal of the calibration unit or a signal derived from the input signal.

3. The capacitance-to-digital converter according to claim 1, comprising a temperature sensor having an output coupled to the calibration unit and generating a temperature signal, wherein the calibration unit is configured to provide a digital output signal that has a polynomial dependency from an input signal of the calibration unit and from the temperature signal or a signal derived from the temperature signal.

4. The capacitance-to-digital converter according to claim 1 or 2, comprising a memory that is coupled to the calibration unit, is realized as a non-volatile memory and stores calibration coefficients.

5. The capacitance-to-digital converter according to claim 1 or 2, wherein the input capacitor is implemented as a capacitive sensor and the capacitor arrangement comprises a further capacitive sensor that detect the same parameter to be measured.

6. The capacitance-to-digital converter according to claim 1 or 2, wherein the capacitor arrangement comprises a reference capacitor and the reference capacitor is realized such that the capacitance value of the reference capacitor can be trimmed or programmed.

7. The capacitance-to-digital converter according to claim 1, wherein the interface circuit comprises a chopping unit that is arranged between the capacitor arrangement and the first integrator.

8. The capacitance-to-digital converter according to claim 1, wherein a second terminal of the first integrating capacitor is coupled to a first output of the first amplifier, and a second terminal of the second integrating capacitor is coupled to a second output of the first amplifier.

9. The capacitance-to-digital converter according to claim 1, wherein the interface circuit comprises an input-common-mode feedback circuit that comprises a control terminal for receiving a control signal and is designed to be enabled or disabled by the control signal.

10. The capacitance-to-digital converter according to claim 1, wherein the converter is realized as a sigma-delta modulator that comprises the interface circuit.

11. A method for providing a digital output signal, comprising:
    providing an analog sensor signal by an input capacitor;
    generating a digital sensor signal by a converter as a function of the analog sensor signal; and
    providing a digital output signal by a calibration unit that is coupled to the converter,
    wherein the converter comprises an interface circuit that is coupled on its input side to the capacitor arrangement and comprises a first integrator having a first amplifier as well as a first and a second integrating capacitor,
    wherein the interface circuit comprises a first and a second chopping unit, such that the first chopping unit couples a first and a second input of the first amplifier to a first terminal of the first integrating capacitor, and the second chopping unit couples the first and the second input of the first amplifier to a first terminal of the second integrating capacitor.

12. The method according to claim 11, wherein the digital output signal has a polynomial dependency from an input signal of the calibration unit or a signal derived from the input signal.

13. A capacitance-to-digital converter, comprising:
    a capacitor arrangement comprising an input capacitor;
    a converter that is coupled on its input side to the capacitor arrangement; and
    a calibration unit that is coupled on its input side to the converter,
    wherein the converter comprises an interface circuit that is coupled on its input side to the capacitor arrangement and comprises a first integrator having a first amplifier as well as a first and a second integrating capacitor,
    wherein the interface circuit comprises an input chopping unit that couples a first and a second input of the first amplifier to the capacitor arrangement, to a first terminal of the first integrating capacitor and to a first terminal of the second integrating capacitor, and wherein the capacitor arrangement is directly connected to the first terminal of the first integrating capacitor and to the first terminal of the second integrating capacitor.

* * * * *